(12) United States Patent
Lee et al.

(10) Patent No.: US 8,882,920 B2
(45) Date of Patent: Nov. 11, 2014

(54) THIN FILM DEPOSITION APPARATUS

(75) Inventors: Jung-Min Lee, Yongin (KR); Choong-Ho Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 886 days.

(21) Appl. No.: 12/794,093

(22) Filed: Jun. 4, 2010

(65) Prior Publication Data
US 2010/0307409 A1 Dec. 9, 2010

(30) Foreign Application Priority Data

Jun. 5, 2009 (KR) .................. 10-2009-0049914
Feb. 5, 2010 (KR) .................. 10-2010-0011196

(51) Int. Cl.
*C23C 16/00* (2006.01)

(52) U.S. Cl.
USPC ........................................ 118/726; 118/727

(58) Field of Classification Search
USPC ................................ 118/726, 727
See application file for complete search history.

(56) References Cited

U.S. PATENT DOCUMENTS

| | | | |
|---|---|---|---|
| 4,687,939 A | 8/1987 | Miyauchi et al. | |
| 4,901,667 A | 2/1990 | Suzuki et al. | |
| 5,742,129 A | 4/1998 | Nagayama et al. | |
| 6,045,671 A | 4/2000 | Wu et al. | |
| 6,091,195 A | 7/2000 | Forrest et al. | |
| 6,274,198 B1 | 8/2001 | Dautartas | |
| 6,280,821 B1 | 8/2001 | Kadunce et al. | |
| 6,371,451 B1 | 4/2002 | Choi | |
| 6,579,422 B1 | 6/2003 | Kakinuma | |
| 6,749,906 B2 | 6/2004 | Van Slyke | |
| 6,878,209 B2* | 4/2005 | Himeshima et al. | 118/720 |
| 6,946,783 B2 | 9/2005 | Kim | |
| 7,006,202 B2 | 2/2006 | Byun et al. | |
| 8,137,466 B2 | 3/2012 | Kang et al. | |
| 8,188,476 B2 | 5/2012 | Takagi et al. | |
| 8,193,011 B2 | 6/2012 | Kang et al. | |
| 8,461,058 B2 | 6/2013 | Prushinskiy et al. | |
| 2001/0006827 A1 | 7/2001 | Yamazaki et al. | |
| 2001/0019807 A1 | 9/2001 | Yamada et al. | |
| 2001/0026638 A1 | 10/2001 | Sangu et al. | |

(Continued)

FOREIGN PATENT DOCUMENTS

| | | |
|---|---|---|
| EP | 1 413 644 | 4/2004 |
| EP | 1 418 250 | 5/2004 |

(Continued)

OTHER PUBLICATIONS

U.S. Appl. No. 13/031,756, filed Feb. 22, 2011, Yong Sup Choi et al., Samsung Mobile Display Co., Ltd.
KIPO Registration Determination Certificate dated Jan. 13, 2012, for Korean patent application 10-2009-0056529, 5 pages.
KIPO Office action dated Feb. 1, 2012, for Korean patent application 10-2010-0031848, 4 pages.
KIPO Registration Determination Certificate dated Sep. 28, 2011, for Korean Patent application 10-2009-0052357, 5 pages.

(Continued)

*Primary Examiner* — Keath Chen
(74) *Attorney, Agent, or Firm* — Christie, Parker & Hale, LLP

(57) ABSTRACT

A thin film deposition apparatus to form a fine pattern on a large substrate. The thin film deposition apparatus includes a deposition source, a first nozzle that is disposed at a side of the deposition source and includes a plurality of first slits, a second nozzle that is disposed opposite to the deposition source and includes a plurality of second slits, and a second nozzle reinforcement unit that is disposed on the second nozzle and crosses the second nozzle.

18 Claims, 11 Drawing Sheets

(56) References Cited

U.S. PATENT DOCUMENTS

| | | |
|---|---|---|
| 2002/0017245 A1 | 2/2002 | Tsubaki et al. |
| 2002/0036759 A1 | 3/2002 | Ise et al. |
| 2002/0050061 A1 | 5/2002 | Komyoji et al. |
| 2002/0076847 A1 | 6/2002 | Yamada et al. |
| 2002/0168577 A1 | 11/2002 | Yoon |
| 2002/0187253 A1 | 12/2002 | Marcus et al. |
| 2003/0021886 A1 | 1/2003 | Baele |
| 2003/0101932 A1 | 6/2003 | Kang |
| 2003/0101937 A1 | 6/2003 | Van Slyke et al. |
| 2003/0118950 A1 | 6/2003 | Chao et al. |
| 2003/0168013 A1 | 9/2003 | Freeman et al. |
| 2003/0221614 A1 | 12/2003 | Kang et al. |
| 2003/0221620 A1 | 12/2003 | Yamazaki |
| 2003/0232563 A1 | 12/2003 | Kamiyama et al. |
| 2004/0029028 A1 | 2/2004 | Shimizu |
| 2004/0056244 A1 | 3/2004 | Marcus et al. |
| 2004/0086639 A1 | 5/2004 | Grantham et al. |
| 2004/0115338 A1* | 6/2004 | Yoneda ............ 427/66 |
| 2004/0115342 A1 | 6/2004 | Shigemura |
| 2004/0127066 A1 | 7/2004 | Jung |
| 2004/0134428 A1 | 7/2004 | Sasaki et al. |
| 2004/0142108 A1 | 7/2004 | Atobe et al. |
| 2004/0144321 A1 | 7/2004 | Grace et al. |
| 2004/0183435 A1 | 9/2004 | Ohshita |
| 2004/0194702 A1 | 10/2004 | Sasaki et al. |
| 2004/0195530 A1 | 10/2004 | Kwak et al. |
| 2004/0216673 A1 | 11/2004 | Sakata et al. |
| 2005/0016461 A1 | 1/2005 | Klug et al. |
| 2005/0031836 A1 | 2/2005 | Hirai |
| 2005/0037136 A1 | 2/2005 | Yamamoto |
| 2005/0072361 A1* | 4/2005 | Yang et al. ............ 118/726 |
| 2005/0110400 A1 | 5/2005 | Nakamura |
| 2005/0129489 A1 | 6/2005 | Quan et al. |
| 2005/0153472 A1 | 7/2005 | Yotsuya |
| 2005/0166842 A1 | 8/2005 | Sakamoto |
| 2005/0229848 A1 | 10/2005 | Shinriki et al. |
| 2005/0263074 A1* | 12/2005 | Masuda et al. ............ 118/726 |
| 2006/0011136 A1 | 1/2006 | Yamazaki et al. |
| 2006/0022590 A1 | 2/2006 | Aziz et al. |
| 2006/0045958 A1 | 3/2006 | Abiko et al. |
| 2006/0090705 A1 | 5/2006 | Kim |
| 2006/0110544 A1 | 5/2006 | Kim et al. |
| 2006/0113907 A1 | 6/2006 | Im et al. |
| 2006/0144325 A1 | 7/2006 | Jung et al. |
| 2006/0152641 A1 | 7/2006 | Brody |
| 2006/0174829 A1 | 8/2006 | An et al. |
| 2006/0205101 A1 | 9/2006 | Lee et al. |
| 2006/0272572 A1 | 12/2006 | Uematsu et al. |
| 2006/0280588 A1 | 12/2006 | Blonigan et al. |
| 2007/0022955 A1 | 2/2007 | Bender et al. |
| 2007/0054044 A1 | 3/2007 | Shimosaki et al. |
| 2007/0077358 A1 | 4/2007 | Jeong et al. |
| 2007/0148337 A1 | 6/2007 | Nichols et al. |
| 2007/0157879 A1 | 7/2007 | Yotsuya |
| 2007/0163497 A1 | 7/2007 | Grace et al. |
| 2007/0178708 A1 | 8/2007 | Ukigaya |
| 2007/0190235 A1 | 8/2007 | Yamazaki et al. |
| 2007/0231460 A1 | 10/2007 | Ukigaya |
| 2008/0018236 A1 | 1/2008 | Arai et al. |
| 2008/0100201 A1 | 5/2008 | Wei et al. |
| 2008/0115729 A1 | 5/2008 | Oda et al. |
| 2008/0129194 A1 | 6/2008 | Abe et al. |
| 2008/0131587 A1 | 6/2008 | Boroson et al. |
| 2008/0145521 A1 | 6/2008 | Guo et al. |
| 2008/0174235 A1 | 7/2008 | Kim et al. |
| 2008/0216741 A1 | 9/2008 | Ling et al. |
| 2008/0238294 A1 | 10/2008 | Xu et al. |
| 2009/0017192 A1 | 1/2009 | Matsuura |
| 2009/0208754 A1 | 8/2009 | Chu et al. |
| 2009/0220691 A1 | 9/2009 | Kim |
| 2009/0229524 A1 | 9/2009 | Kim et al. |
| 2009/0232976 A1 | 9/2009 | Yoon et al. |
| 2009/0277386 A1 | 11/2009 | Takagi et al. |
| 2010/0001301 A1 | 1/2010 | Karg et al. |
| 2010/0055810 A1 | 3/2010 | Sung et al. |
| 2010/0086672 A1 | 4/2010 | Von Drasek et al. |
| 2010/0165454 A1 | 7/2010 | Suetsugu et al. |
| 2010/0192856 A1 | 8/2010 | Sung et al. |
| 2010/0196607 A1 | 8/2010 | Carlson et al. |
| 2010/0271602 A1 | 10/2010 | Hanazaki |
| 2010/0297348 A1 | 11/2010 | Lee et al. |
| 2010/0297349 A1 | 11/2010 | Lee et al. |
| 2010/0310768 A1 | 12/2010 | Lee et al. |
| 2010/0330265 A1 | 12/2010 | Lee et al. |
| 2010/0330712 A1 | 12/2010 | Lee et al. |
| 2011/0033619 A1 | 2/2011 | Lee et al. |
| 2011/0033621 A1 | 2/2011 | Lee et al. |
| 2011/0048320 A1 | 3/2011 | Choi et al. |
| 2011/0052791 A1 | 3/2011 | Jo et al. |
| 2011/0052795 A1 | 3/2011 | Choi et al. |
| 2011/0053296 A1 | 3/2011 | Lee et al. |
| 2011/0053300 A1 | 3/2011 | Ryu et al. |
| 2011/0053301 A1 | 3/2011 | Kang et al. |
| 2011/0088622 A1 | 4/2011 | Choi et al. |
| 2011/0165327 A1 | 7/2011 | Park et al. |
| 2011/0168986 A1 | 7/2011 | Lee et al. |
| 2011/0186820 A1 | 8/2011 | Kim et al. |
| 2011/0220019 A1 | 9/2011 | Lee et al. |
| 2011/0244120 A1 | 10/2011 | Choi et al. |
| 2011/0262625 A1 | 10/2011 | Park et al. |
| 2011/0266944 A1 | 11/2011 | Song et al. |
| 2012/0009328 A1 | 1/2012 | Ryu et al. |
| 2012/0009332 A1 | 1/2012 | Kim et al. |
| 2012/0009706 A1 | 1/2012 | Choi et al. |
| 2012/0028390 A1 | 2/2012 | Lee et al. |
| 2012/0083061 A1 | 4/2012 | Kang et al. |
| 2012/0097992 A1 | 4/2012 | Jeong |
| 2012/0100282 A1 | 4/2012 | Lee et al. |
| 2012/0100644 A1 | 4/2012 | Prushinskiy et al. |
| 2012/0103253 A1 | 5/2012 | Park et al. |
| 2012/0145077 A1 | 6/2012 | Chang et al. |
| 2012/0174865 A1 | 7/2012 | Choi et al. |
| 2012/0183676 A1 | 7/2012 | Sonoda et al. |
| 2012/0298970 A1 | 11/2012 | Lee et al. |
| 2012/0299016 A1 | 11/2012 | Choi |
| 2012/0299023 A1 | 11/2012 | Lee et al. |
| 2012/0301614 A1 | 11/2012 | Choi et al. |
| 2012/0301986 A1 | 11/2012 | Choi et al. |
| 2012/0313251 A1 | 12/2012 | Kato |
| 2013/0008379 A1 | 1/2013 | Chang et al. |
| 2013/0157016 A1 | 6/2013 | Kim |

FOREIGN PATENT DOCUMENTS

| | | |
|---|---|---|
| EP | 1 518 940 | 3/2005 |
| JP | 57-194252 | 11/1982 |
| JP | 4-272170 | 9/1992 |
| JP | 05-230628 | 9/1993 |
| JP | 08-027568 | 1/1996 |
| JP | 09-095776 | 4/1997 |
| JP | 2000-68054 | 3/2000 |
| JP | 2001-52862 | 2/2001 |
| JP | 2001-93667 | 4/2001 |
| JP | 2002-075638 | 3/2002 |
| JP | 2002-175878 | 6/2002 |
| JP | 2003-3250 | 1/2003 |
| JP | 2003-77662 | 3/2003 |
| JP | 2003-157973 | 5/2003 |
| JP | 2003-197531 A2 | 7/2003 |
| JP | 2003-297562 | 10/2003 |
| JP | 2003-321767 | 11/2003 |
| JP | 2004-35964 A2 | 2/2004 |
| JP | 2004-43898 | 2/2004 |
| JP | 200476150 A2 | 3/2004 |
| JP | 2004-103269 | 4/2004 |
| JP | 2004-103341 | 4/2004 |
| JP | 2004137583 A2 | 5/2004 |
| JP | 2004-169169 | 6/2004 |
| JP | 2004-199919 | 7/2004 |
| JP | 2004-349101 | 12/2004 |
| JP | 2005-44592 | 2/2005 |
| JP | 2005-122980 | 5/2005 |
| JP | 2005-165015 | 6/2005 |
| JP | 2005-174843 | 6/2005 |

(56) References Cited

FOREIGN PATENT DOCUMENTS

| | | |
|---|---|---|
| JP | 2005-206939 | 8/2005 |
| JP | 2005-235568 | 9/2005 |
| JP | 2005-293968 | 10/2005 |
| JP | 2005-296737 | 10/2005 |
| JP | 2006-028583 | 2/2006 |
| JP | 2006-172930 | 6/2006 |
| JP | 2006-176809 | 7/2006 |
| JP | 2006-210038 | 8/2006 |
| JP | 2006-275433 | 10/2006 |
| JP | 2006-292955 | 10/2006 |
| JP | 2007-47293 | 2/2007 |
| JP | 2007-186740 | 7/2007 |
| JP | 2007-291506 A2 | 11/2007 |
| JP | 2008-108628 | 5/2008 |
| JP | 2008-121098 | 5/2008 |
| JP | 2008-521165 | 6/2008 |
| JP | 2009-19243 | 1/2009 |
| JP | 2009-024208 | 2/2009 |
| JP | 2009-081165 | 4/2009 |
| JP | 2009-87910 | 4/2009 |
| JP | 2010-261081 | 11/2010 |
| KR | 10-0257219 | 2/2000 |
| KR | 10-2000-0019254 | 4/2000 |
| KR | 10-2000-0023929 | 5/2000 |
| KR | 10-2001-0024652 | 3/2001 |
| KR | 10-2001-0059939 | 7/2001 |
| KR | 10-2001-0092914 | 10/2001 |
| KR | 10-2001-0093666 | 10/2001 |
| KR | 20-0257218 Y1 | 12/2001 |
| KR | 10-2002-0000201 | 1/2002 |
| KR | 10-2002-0001555 | 1/2002 |
| KR | 10-2002-0050922 | 6/2002 |
| KR | 10-2002-0090934 | 12/2002 |
| KR | 10-2003-0001745 | 1/2003 |
| KR | 10-2003-0034730 | 5/2003 |
| KR | 10-2003-0046090 | 6/2003 |
| KR | 2003-0069684 | 8/2003 |
| KR | 10-0405080 | 10/2003 |
| KR | 10-2003-0091947 | 12/2003 |
| KR | 10-2003-0093959 | 12/2003 |
| KR | 10-2003-0094033 | 12/2003 |
| KR | 10-2004-0014258 | 2/2004 |
| KR | 10-2004-0034537 | 4/2004 |
| KR | 10-2004-0050045 | 6/2004 |
| KR | 10-2004-0069281 | 8/2004 |
| KR | 10-2004-0084747 | 10/2004 |
| KR | 10-2004-0087142 | 10/2004 |
| KR | 10-0463212 | 12/2004 |
| KR | 10-2005-0062853 | 6/2005 |
| KR | 10-0520159 | 9/2005 |
| KR | 10-2006-0008602 | 1/2006 |
| KR | 10-2006-0018745 | 3/2006 |
| KR | 2006-0020050 | 3/2006 |
| KR | 10-2006-0056706 | 5/2006 |
| KR | 10-2006-0058459 | 5/2006 |
| KR | 2006-0049050 | 5/2006 |
| KR | 10-2006-0065978 | 6/2006 |
| KR | 10-2006-0073367 | 6/2006 |
| KR | 2006-0059068 | 6/2006 |
| KR | 10-2006-0080475 | 7/2006 |
| KR | 10-2006-0080481 | 7/2006 |
| KR | 10-2006-0080482 | 7/2006 |
| KR | 10-2006-0083510 | 7/2006 |
| KR | 10-2006-0092387 | 8/2006 |
| KR | 10-2006-0098755 | 9/2006 |
| KR | 10-2006-0104288 | 10/2006 |
| KR | 10-2006-0104675 | 10/2006 |
| KR | 10-2006-0104677 | 10/2006 |
| KR | 10-2006-0109627 | 10/2006 |
| KR | 10-0635903 B1 | 10/2006 |
| KR | 10-2006-0114462 | 11/2006 |
| KR | 10-0645719 B1 | 11/2006 |
| KR | 10-646160 | 11/2006 |
| KR | 10-2006-0123944 | 12/2006 |
| KR | 10-0687007 | 2/2007 |
| KR | 10-2007-0025164 | 3/2007 |
| KR | 10-2007-0035796 | 3/2007 |
| KR | 10-0696547 | 3/2007 |
| KR | 10-0696550 | 3/2007 |
| KR | 10-0697663 B1 | 3/2007 |
| KR | 10-0698033 | 3/2007 |
| KR | 10-0700466 | 3/2007 |
| KR | 10-0711885 | 4/2007 |
| KR | 10-2007-0050793 | 5/2007 |
| KR | 10-0723627 | 5/2007 |
| KR | 10-0726132 | 6/2007 |
| KR | 10-0739309 B1 | 7/2007 |
| KR | 10-2007-0078713 | 8/2007 |
| KR | 10-2007-0080635 | 8/2007 |
| KR | 10-2007-0097218 | 10/2007 |
| KR | 10-2007-0101842 | 10/2007 |
| KR | 10-2007-0105595 | 10/2007 |
| KR | 10-0770653 | 10/2007 |
| KR | 10-2007-0112668 | 11/2007 |
| KR | 10-0787457 B1 | 12/2007 |
| KR | 10-2008-0001184 | 1/2008 |
| KR | 10-2008-0003720 | 1/2008 |
| KR | 10-0797787 | 1/2008 |
| KR | 10-0800125 | 1/2008 |
| KR | 10-0815265 | 3/2008 |
| KR | 10-2008-0036983 | 4/2008 |
| KR | 10-0823508 | 4/2008 |
| KR | 10-0827760 | 4/2008 |
| KR | 10-2008-0044775 | 5/2008 |
| KR | 10-2008-0048653 | 6/2008 |
| KR | 10-2008-0055124 | 6/2008 |
| KR | 10-0839380 | 6/2008 |
| KR | 10-2008-0060400 | 7/2008 |
| KR | 10-2008-0061132 | 7/2008 |
| KR | 10-2008-0061666 | 7/2008 |
| KR | 10-2008-0061774 | 7/2008 |
| KR | 10-2008-0062212 | 7/2008 |
| KR | 10-2008-0109559 | 12/2008 |
| KR | 10-0889872 B1 | 3/2009 |
| KR | 10-2009-0038733 | 4/2009 |
| KR | 10-2009-0040618 | 4/2009 |
| KR | 10-2009-0052155 | 5/2009 |
| KR | 10-2009-0053417 | 5/2009 |
| KR | 10-2009-0066996 | 6/2009 |
| KR | 10-0908232 B1 | 7/2009 |
| KR | 10-2009-0093161 | 9/2009 |
| KR | 10-2009-0097453 | 9/2009 |
| KR | 10-2010-0000128 | 1/2010 |
| KR | 10-2010-0000129 | 1/2010 |
| KR | 10-2010-0026655 | 3/2010 |
| KR | 10-2010-0047796 | 5/2010 |
| KR | 10-2010-0090070 | 8/2010 |
| KR | 10-2010-0099806 | 9/2010 |
| KR | 10-2010-0126125 | 12/2010 |
| KR | 10-2011-0101767 | 9/2011 |
| KR | 10-2012-0006324 | 1/2012 |
| WO | WO 99/025894 A1 | 5/1999 |
| WO | WO 2008/004792 A1 | 1/2008 |

OTHER PUBLICATIONS

KIPO Registration Determination Certificate dated Nov. 25, 2011, for Korean Patent application 10-2010-0014277, 5 pages.
KIPO Office action dated Feb. 1, 2012, for Korean patent application 10-2010-0011196, 4 pages.
KIPO Registration Determination Certificate dated Jul. 20, 2012, for Korean priority Patent application 10-2010-0003545, (5 pages).
KIPO Registration Determination Certificate dated Apr. 30, 2012, for Korean priority Patent application 10-2010-0066992, (5 pages).
Japanese Office action dated Aug. 21, 2012, for Japanese Patent application 2010-145075, (5 pages).
KIPO Office action dated Sep. 1, 2012, for Korean Patent application 10-2010-0010136, (5 pages).
KIPO Notice of Allowance dated Sep. 1, 2012, for Korean Patent application 10-2010-0013848, (5 pages).
KIPO Notice of Allowance dated Sep. 1, 2012, for Korean Patent application 10-2010-0009160, (5 pages).
Japanese Office action dated Sep. 4, 2012, for Japanese Patent application 2010-152846, (4 pages).

(56) References Cited

OTHER PUBLICATIONS

English machine translation of Japanese Publication 2004-349101 previously filed in an IDS dated Oct. 26, 2012, (11 pages).
Patent Abstracts of Japan, and English machine translation of Japanese Publication 2009-024208 listed above, (30 pages).
KIPO Office action dated Aug. 1, 2011 for Korean Patent application 10-2009-0074001, (3 pages).
KIPO Office action dated Feb. 1, 2012 for Korean Patent application 10-2010-0014272, (4 pages).
KIPO Office action dated Feb. 6, 2012 for Korean Patent application 10-2010-0021835, (4 pages).
KIPO Office action dated Apr. 2, 2012 for Korean Patent application 10-2010-0066993, (4 pages).
KIPO Notice of Allowance dated Aug. 24, 2012 for Korean Patent application 10-2010-0066993, (5 pages).
KIPO Notice of Allowance dated Sep. 1, 2012 for Korean Patent application 10-2010-0014276, (5 pages).
KIPO Office action dated Aug. 28, 2012 for Korean Patent application 10-2010-0014274, (5 pages).
KIPO Notice of Allowance dated Oct. 31, 2011 for Korean Patent application 10-2010-0014273, (5 pages).
KIPO Office action dated Feb. 6, 2012 for Korean Patent application 10-2010-0014274, (9 pages).
U.S. Office action dated Sep. 12, 2012 for cross reference U.S. Appl. No. 12/815,673, (26 pages).
U.S. Office action dated Dec. 17, 2012 for cross reference U.S. Appl. No. 12/873,556, (37 pages).
U.S. Office action dated Dec. 26, 2012 for cross reference U.S. Appl. No. 12/815,673, (21 pages).
U.S. Office action dated Dec. 20, 2012 for cross reference U.S. Appl. No. 12/984,289, (20 pages).
U.S. Notice of Allowance dated Mar. 18, 2013 for cross reference U.S. Appl. No. 12/795,001, (29 pages).
U.S. Office action dated Jan. 25, 2013 for cross reference U.S. Appl. No. 13/015,357, (21 pages).
English-language abstract of Korean Publication No. KR 10-2002-0034272.
English-language abstract of Korean Publication No. KR 10-2002-0056238.
English-language abstract of Korean Publication No. KR 10-2002-0088662.
English-language abstract of Korean Publication No. KR 10-2005-0045619.
English-language abstract of Korean Publication No. KR 10-2006-0126267.
English-language abstract of Korean Publication No. KR 10-2008-0038650.
U.S. Appl. No. 12/784,774, filed May 21, 2010, Choong-Ho Lee et al., Samsung Mobile Display Co., Ltd.
U.S. Appl. No. 13/014,225, filed Jan. 26, 2011, Jong-Won Hong et al., Samsung Mobile Display Co., Ltd.
U.S. Appl. No. 12/797,858, filed Jun. 10, 2010, Choong-Ho Lee et al., Samsung Mobile Display Co., Ltd.
U.S. Appl. No. 12/836,760, filed Jul. 15, 2010, Jong-Heon Kim, et al., Samsung Mobile Display Co., Ltd.
U.S. Appl. No. 12/784,804, filed May 21, 2010, Choong-Ho Lee, et al., Samsung Mobile Display Co., Ltd.
U.S. Appl. No. 12/849,193, filed Aug. 3, 2010, Ji-Sook Oh et al., Samsung Mobile Display Co., Ltd.
U.S. Appl. No. 12/979,193, filed Dec. 28, 2010, Hyun Sook Park et al., Samsung Mobile Display Co., Ltd.
U.S. Appl. No. 12/820,355, filed Jun. 22, 2010, Yong-Sup Choi et al., Samsung Mobile Display Co., Ltd.
U.S. Appl. No. 12/950,361, filed Nov. 19, 2010, Choong-Ho Lee, et al., Samsung Mobile Display Co., Ltd.
U.S. Appl. No. 12/795,896, filed Jun. 8, 2010, Jung-Min Lee, et al., Samsung Mobile Display Co., Ltd.
U.S. Appl. No. 12/856,942, filed Aug. 16, 2010, Yun-Mi Lee et al., Samsung Mobile Display Co., Ltd.
U.S. Appl. No. 12/814,816, filed Jun. 14, 2010, Jung-Min Lee et al., Samsung Mobile Display Co., Ltd.
U.S. Appl. No. 12/868,099, filed Aug. 25, 2010, Hee-Cheol Kang, et al., Samsung Mobile Display Co., Ltd.
U.S. Appl. No. 12/862,153, filed Aug. 24, 2010, Hee-Cheol Kang, et al., Samsung Mobile Display Co., Ltd.
U.S. Appl. No. 12/869,830, filed Aug. 27, 2010, Chang-Mog Jo, et al., Samsung Mobile Display Co., Ltd.
U.S. Appl. No. 12/849,092, filed Aug. 3, 2010, Choong-Ho Lee et al., Samsung Mobile Display Co., Ltd.
U.S. Appl. No. 12/873,556, filed Sep. 1, 2010, Young-Mook Choi, et al., Samsung Mobile Display Co., Ltd.
U.S. Appl. No. 12/873,689, filed Sep. 1, 2010, Young-Mook Choi, et al., Samsung Mobile Display Co., Ltd.
U.S. Appl. No. 12/815,673, filed Jun. 15, 2010, Jung-Min Lee, Samsung Mobile Display Co., Ltd.
U.S. Appl. No. 12/862,125, filed Aug. 24, 2010, Jae-Kwang Ryu et al., Samsung Mobile Display Co., Ltd.
U.S. Appl. No. 12/795,001, filed Jun. 7, 2010, Choong-Ho Lee et al., Samsung Mobile Display Co., Ltd.
U.S. Appl. No. 12/813,786, filed Jun. 11, 2010, Choong-Ho Lee et al., Samsung Mobile Display Co., Ltd.
U.S. Appl. No. 12/820,270, filed Jun. 22, 2010, Jung-Min Lee et al., Samsung Mobile Display Co., Ltd.
U.S. Appl. No. 12/907,396, filed Oct. 19, 2010, Yong-Sup Choi, et al., Samsung Mobile Display Co., Ltd.
U.S. Appl. No. 12/987,569, filed Jan. 10, 2011, Yun-Mi Lee et al., Samsung Mobile Display Co., Ltd.
U.S. Appl. No. 12/984,289, filed Jan. 4, 2011, Jung-Yeong Kim et al., Samsung Mobile Display Co., Ltd.
U.S. Office action dated Oct. 11, 2013 for cross-reference U.S. Appl. No. 12/907,396, 14 pages.
U.S. Office action dated Apr. 1, 2013, issued to U.S. Appl. No. 12/784,774 (44 pages).
U.S. Office action dated Aug. 13, 2013, issued to U.S. Appl. No. 13/194,759, (28 pages).
U.S. Office action dated Aug. 7, 2013, issued to U.S. Appl. No. 13/015,357, (30 pages).
U.S. Office action dated Jul. 17, 2013, issued to U.S. Appl. No. 12/984,231, (18 pages).
U.S. Office action dated Jul. 5, 2013, issued to U.S. Appl. No. 12/873,556, (17 pages).
U.S. Office action dated Jul. 3, 2013 in U.S. Appl. No. 12/873,689 (48 pages).
U.S. Office action dated Jun. 11, 2013, issued to U.S. Appl. No. 12/862,125 (37 pages).
U.S. Office action dated Mar. 15, 2013, issued to U.S. Appl. No. 12/813,786 (33 pages).
U.S. Office action dated Mar. 18, 2013, issued to U.S. Appl. No. 12/984,231 (29 pages).
U.S. Office action dated Mar. 19, 2013, issued to U.S. Appl. No. 13/194,759 (36 pages).
U.S. Office action dated Mar. 22, 2013, issued to U.S. Appl. No. 12/987,569 (12 pages).
U.S. Office action dated May 24, 2013, issued to U.S. Appl. No. 12/849,092 (31 pages).
U.S. Office Action dated May 7, 2013, issued in U.S. Appl. No. 12/820,270 (37 pages).
U.S. Office action dated Nov. 22, 2013, issued to U.S. Appl. No. 13/198,591, (28 pages).
U.S. Office action dated Oct. 1, 2013, issued to U.S. Appl. No. 12/849,092, (13 pages).
U.S. Office action dated Oct. 21, 2013, issued to U.S. Appl. No. 12/987,569, (14 pages).
U.S. Office action dated Sep. 20, 2013, issued to U.S. Appl. No. 13/014,225, (33 pages).

* cited by examiner

THIN FILM DEPOSITION APPARATUS

CROSS-REFERENCE TO RELATED APPLICATIONS

This application claims the benefit of Korean Patent Application No. 10-2009-0049914, filed on Jun. 5, 2009 and Korean Patent Application No. 10-2010-0011196, filed Feb. 5, 2010, in the Korean Intellectual Property Office, the disclosures of which are incorporated herein in their entirety by reference.

BACKGROUND OF THE INVENTION

1. Field of the Invention

Aspects of the present invention relate to a thin film deposition apparatus, and more particularly, to an apparatus for forming a fine pattern on a large substrate.

2. Description of the Related Art

Organic light-emitting display devices have a larger viewing angle, better contrast characteristics, and a faster response rate than other display devices, and thus have drawn attention as a next-generation display device.

In general, organic light-emitting display devices may generate visible light by using light emission when holes and electrons injected from anode and cathode electrodes are recombined in an organic emission layer. However, it is difficult to achieve high light-emission efficiency with such a structure, and thus organic layers, such as an electron injection layer, an electron transport layer, a hole transport layer, and a hole injection layer, are optionally additionally interposed between the emission layer and each of the electrodes.

Electrodes, an organic emission layer, and an organic layer of such an organic light-emitting display device may be formed using a variety of methods one of which is a deposition method. When an organic light-emitting display device is manufactured by using the deposition method, a fine metal mask (FMM) having the same pattern as a thin film to be formed is disposed to closely contact a substrate, and a thin film material is deposited over the FMM in order to form the thin film having the desired pattern.

However, it is actually difficult to form a fine pattern of an organic thin film, such as an organic emission layer or an organic layer, and the luminous efficiency of red, green, and blue colors may vary according to the pattern and thickness of the organic thin film. Thus, there is a limit in improving the luminous characteristics of organic light-emitting display devices.

Also, recently, there is higher demand for large-sized display devices but it is difficult to pattern organic thin films on a large surface using conventional thin film deposition apparatuses. Thus it is difficult to manufacture large-sized organic light-emitting display devices having satisfactory levels of driving voltage, current density, luminance, color purity, luminous efficiency, lifetime, etc.

SUMMARY OF THE INVENTION

According to an aspect of the present invention there is provided a thin film deposition apparatus capable of forming a fine pattern on a large substrate.

According to an aspect of the present invention, there is provided a thin film deposition apparatus including a deposition source, a first nozzle disposed at a side of the deposition source and including a plurality of first slits, a second nozzle disposed opposite to the first nozzle and including a plurality of second slits, and a second nozzle reinforcement unit disposed on the second nozzle and crossing the second slits The second nozzle reinforcement unit may be disposed on a side of the second nozzle facing the deposition source.

The second nozzle reinforcement unit may be disposed on a surface of the second nozzle facing away from a deposition target.

The second nozzle reinforcement unit may contact the second nozzle.

A unique number of oscillation of the second nozzle reinforcement unit may be different from a unique number of oscillation of the second nozzle.

A plurality of second nozzle reinforcement units may be installed.

The second nozzle reinforcement unit may extend along a direction in which the second slits are arranged.

The thin film deposition apparatus may further include a first barrier wall assembly including a plurality of first barrier walls to partition a deposition space between the first nozzle and the second nozzle.

The first and second slits may be arranged in a direction, and the first barrier walls may be arranged substantially perpendicular to the direction in which the first and second slits are arranged in order to partition the deposition space between the first nozzle and the second nozzle.

At least one of the first slits may be disposed between each two adjacent first barrier walls.

A plurality of the second slits may be disposed between each two adjacent first barrier walls.

A number of second slits disposed between each two adjacent first barrier walls may be greater than a number of first slits disposed between each two adjacent first barrier walls.

The first barrier wall assembly may be detachable from the thin film deposition apparatus.

The thin film deposition apparatus may further include a second barrier wall assembly disposed at a side of the first barrier wall assembly and including a plurality of second barrier walls arranged in a direction in which the first and second slits are arranged.

The first and second slits may be arranged in a direction, and the second barrier walls may be arranged substantially perpendicular to the direction in the first and second slits are arranged in order to partition a deposition space between the first nozzle and the second nozzle.

The first barrier walls may be arranged to correspond to the second barrier walls.

Each pair of the corresponding first and second barrier walls may be arranged on substantially the same plane.

According to another aspect of the present invention, a width of the first barrier walls is greater than a width of the second barrier walls, in the direction in which the first barrier walls are arranged.

The first barrier walls and the second barrier walls may be respectively arranged at equal intervals.

The first barrier walls may be separated apart from the second barrier walls.

The second barrier walls may be separated from the second nozzle by a predetermined distance.

The first slits may be arranged in a first direction, and the second slits may be arranged in a second direction parallel to the first direction.

The thin film deposition apparatus may perform deposition while being moved relative to a deposition target in the first direction.

The deposition source, the first nozzle, and the second nozzle may be formed integrally with one another.

The deposition source, the first nozzle, and the second nozzle may be formed integrally with one another by being coupled to one another via a connection unit.

The connection unit may guide movement of the deposition material contained in the deposition source.

The connection unit may seal a deposition space among the deposition source, the first nozzle, and the second nozzle.

The deposition material may be continuously deposited on the deposition target while the deposition target is moved relative to the thin film deposition apparatus in the first direction.

The first slits may be tilted at a predetermined angle.

According to another aspect of the present invention, each of the first slits may include first sub slits arranged in two rows in the first direction, and the first sub slits in the two rows are tilted to face each other.

Each of the first slits may include first sub slits arranged in two rows in the first direction. From among the first sub slits, some first sub slits at a first side of the first nozzle may be arranged to face a second end portion of the second nozzle, and the other first sub slits at a second side of the first nozzle may be arranged to face a first end portion of the second nozzle.

The thin film deposition apparatus may be disposed in a vacuum chamber.

The second nozzle may be separated a certain distance from a deposition target on which a deposition material vaporized in the deposition source is deposited.

A width of the second nozzle may be substantially equal to a width of the target in a direction.

The thin film deposition apparatus may further include a second nozzle frame coupled to regions of the second nozzle in which the second slits are not formed.

The second nozzle frame may exert a predetermined tensile force on the second nozzle.

A temperature of the second nozzle frame may be maintained substantially constant during deposition.

A total number of the second slits may be greater than a total number of the first slits.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
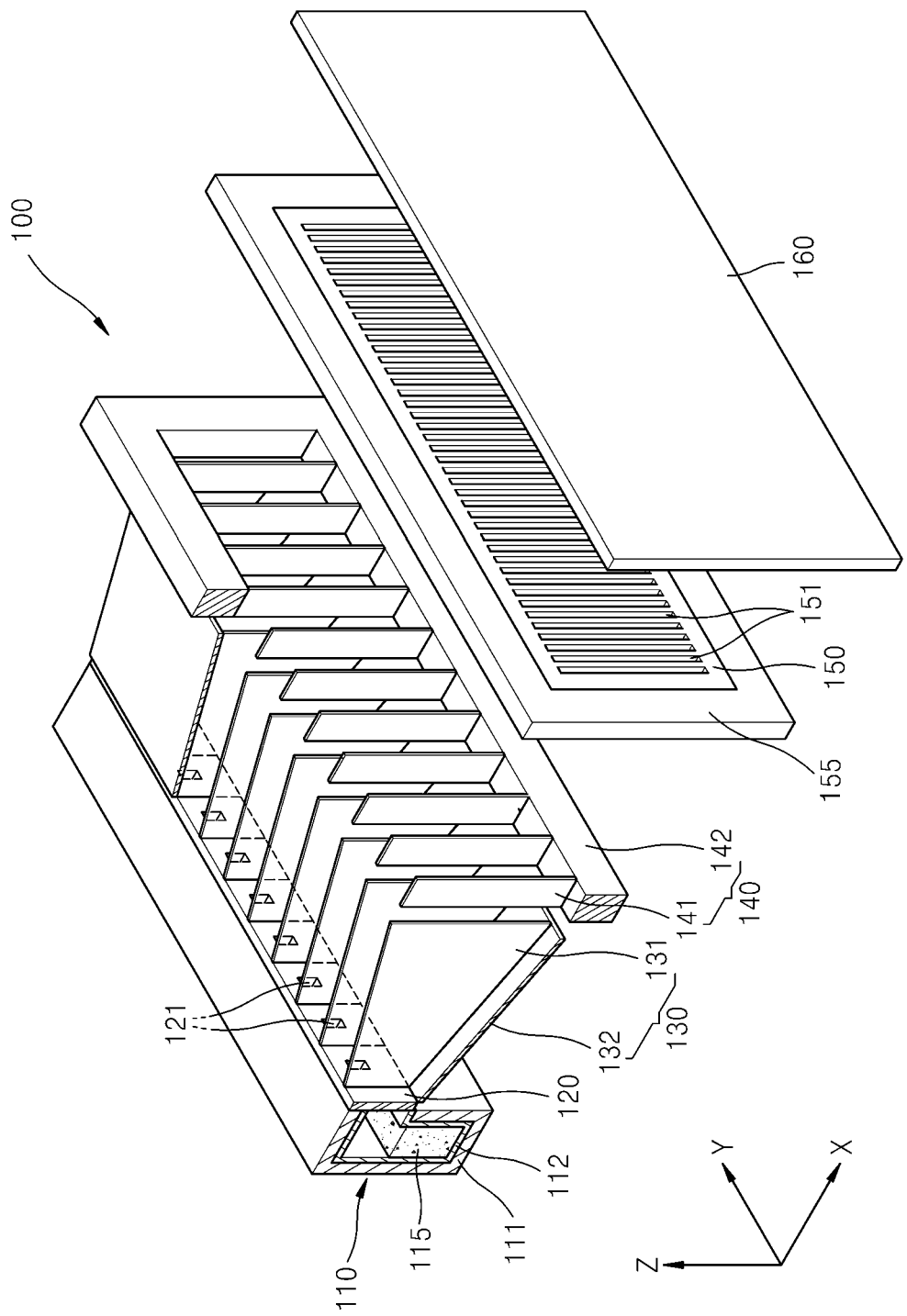
FIG. 1 is a schematic perspective view of a thin film deposition apparatus according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures. Moreover, it is to be understood that where is stated herein that one film or layer is "formed on" or "disposed on" a second layer or film, the first layer or film may be formed or disposed directly on the second layer or film or there may be intervening layers or films between the first layer or film and the second layer or film. Further, as used herein, the term "formed on" is used with the same meaning as "located on" or "disposed on" and is not meant to be limiting regarding any particular fabrication process. Further, some of the elements that are not essential to the complete understanding of the invention are omitted for clarity. Also, like reference numerals refer to like elements throughout. Hereinafter, exemplary embodiments of the present invention will be described with reference to the accompanying drawings.

Figure 2:
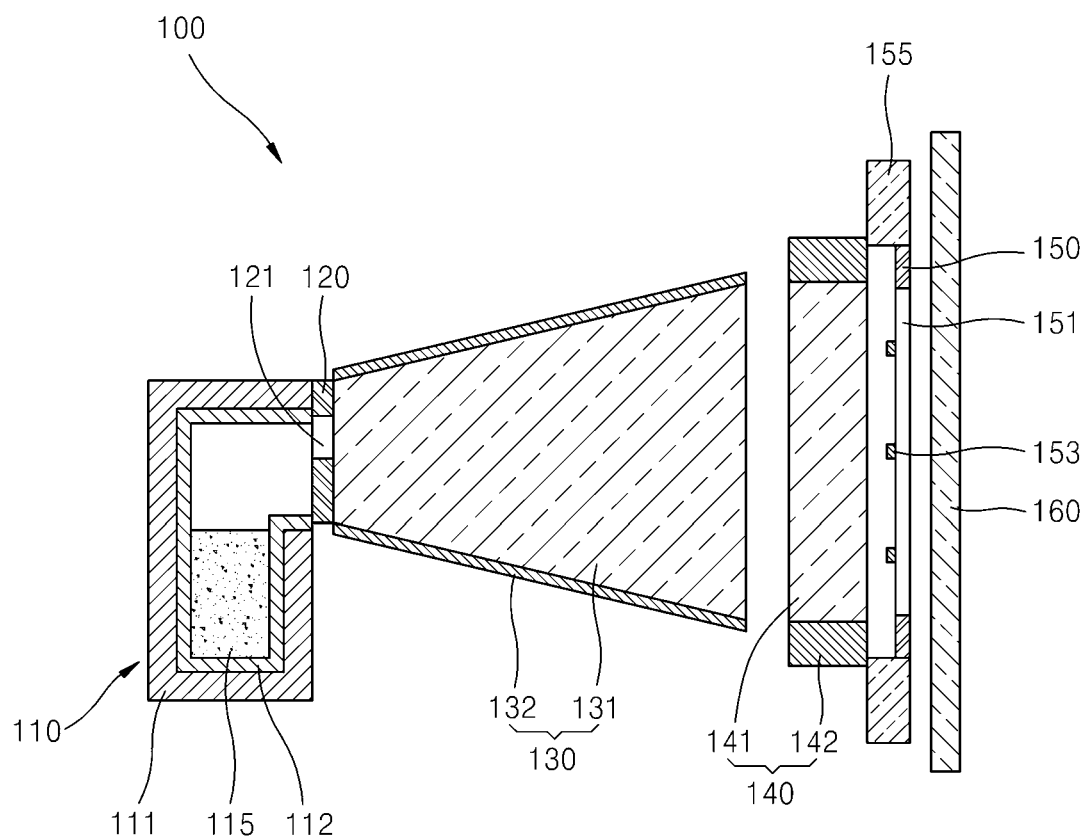
FIG. 2 is a schematic side view of the thin film deposition apparatus of FIG. 1.
Figure 3:
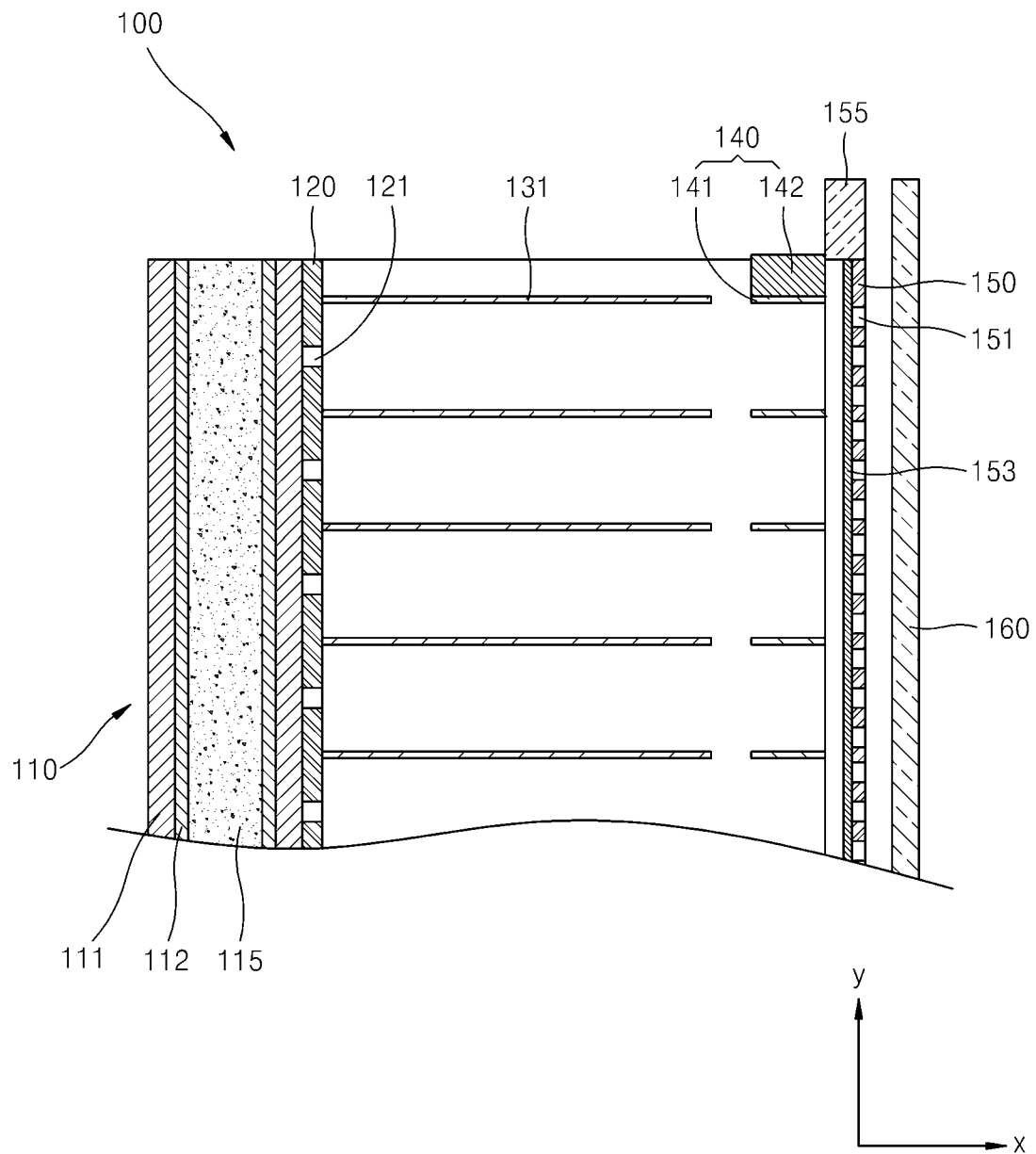
FIG. 3 is a schematic plan view of the thin film deposition apparatus of FIG. 1, according to an embodiment of the present invention.

FIG. 1 is a schematic perspective view of a thin film deposition apparatus 100 according to an embodiment of the present invention. FIG. 2 is a schematic side view of the thin film deposition apparatus 100. FIG. 3 is a schematic plan view of the thin film deposition apparatus 100.

Referring to FIGS. 1, 2 and 3, the thin film deposition apparatus 100 includes a deposition source 110 for depositing a deposition material 115 on a substrate 160, a first nozzle 120, a first barrier wall assembly 130, a second barrier wall assembly 140, a second nozzle 150, and a second nozzle frame 155. According to other aspects of the present invention, the thin film deposition apparatus 100 may include additional and/or different components, such as in the examples described below. The second barrier wall assembly 140 includes a plurality of second barrier walls 141 and a second barrier wall frame 142.

Although not illustrated in FIGS. 1, 2 and 3 for convenience of explanation, all the components of the thin film deposition apparatus 100 may be disposed within a chamber that is maintained at an appropriate degree of vacuum. The chamber is maintained at an appropriate vacuum in order to allow the deposition material 115 to move in a substantially straight line through the thin film deposition apparatus 100.

Specifically, in order to deposit the deposition material 115 emitted from the deposition source 110 and discharged through the first nozzle 120 and the second nozzle 150, on the substrate 160 in a desired pattern, the chamber should be maintained in a high-vacuum state as in a deposition method using a fine metal mask (FMM). In addition, the temperatures of the first barrier wall assembly 130, the second barrier wall assembly 140 and the second nozzle 150 should be sufficiently lower than the temperature of the deposition source 110 in order to maintain the space between the first and second nozzles 120 and 150 in a high vacuum state. In this regard, the temperatures of the first barrier wall assembly 130, the second barrier wall assembly 140 and the second nozzle 150 may be about 100° C. or less than the deposition source. This is so the deposition material 115 that has collided against the first barrier wall assembly 130 and the second barrier wall assembly 140 does not vaporize again if the temperatures of the first barrier wall assembly 130 and the second barrier wall assembly 140 were too high. In addition, thermal expansion of the second nozzle 150 may be minimized when the temperature of the second nozzle 150 is sufficiently low. The first barrier wall assembly 130 faces the deposition source 110, which is at a high temperature. In addition, the temperature of a portion of the first barrier wall assembly 130 close to the deposition source 110 rises by a maximum of about 85° C. Thus a partial-cooling device may be further included if needed. Therefore, each of the first barrier wall assembly 130 and the second barrier wall assembly 140 may include a cooling member, such as cooling fins.

The substrate 160 that is a deposition target substrate is disposed in the chamber. The substrate 160 may be a substrate for flat panel displays. A large substrate, such as a mother glass, for manufacturing a plurality of flat panel displays, may be used as the substrate 160.

The deposition source 110 that contains and heats the deposition material 115 is disposed in an opposite side of the chamber to the side in which the substrate 160 is disposed. As the deposition material 115 contained in the deposition source 110 is vaporized, the deposition material 115 is deposited on the substrate 160. The deposition source 110 includes a crucible 111 and a heater 112. The crucible 111 holds the deposition material 115. The heater 112 heats the crucible 111 to vaporize the deposition material 115 contained in the crucible 111 towards a side of the crucible 111, and in particular, towards the first nozzle 120.

The first nozzle 120 is disposed at a side of the deposition source 110 facing the substrate 160. The first nozzle 120 includes a plurality of first slits 121 that may be arranged at equal intervals in a Y-axis direction. The deposition material 115 that is vaporized in the deposition source 110 passes through the first nozzle 120 towards the substrate 160.

The first barrier wall assembly 130 is disposed at a side of the first nozzle 120. The first barrier wall assembly 130 includes a plurality of first barrier walls 131, and a first barrier wall frame 132 that covers sides of the first barrier walls 131 that cover sides of the first barrier walls 131. The plurality of first barrier walls 131 may be arranged parallel to each other at equal intervals in the Y-axis direction. In addition, each of the first barrier walls 131 may be formed to extend along an XZ plane in FIG. 1, i.e., perpendicular to the Y-axis direction. The plurality of first barrier walls 131 arranged as described above partition the deposition space between the first nozzle 120 and the second nozzle 150. In the thin film deposition apparatus 100, the deposition space is divided by the first barrier walls 131 and second barrier walls 141, which will be described later, into sub-deposition spaces that respectively correspond to the first slits 121 through which the deposition material 115 is discharged.

The first barrier walls 131 may be respectively disposed between adjacent first slits 121. In other words, each of the first slits 121 may be disposed between two adjacent first barrier walls 131. The first slits 121 may be respectively located at the midpoint between two adjacent first barrier walls 131. As described above, since the first barrier walls 131 partition the deposition space between the first nozzle 120 and the second nozzle 150, the deposition material 115 discharged through one of the first slits 121 is not mixed with deposition material 115 discharged through other first slits 121. The deposition material 115 then passes through second slits 151, which will be described later, so as to be deposited on the substrate 160. Thus, the first barrier walls 131 guide the deposition material 115, which is discharged through the first slits 121, so as not to flow in the Y-axis direction.

The first barrier wall frame 132, which covers upper and lower outer sides of the first barrier walls 131, supports the first barrier walls 131, and guides the deposition material 115, which is discharged through the first slits 121, so as not to flow in a Z-axis direction.

The first barrier wall assembly 130 may be constructed to be detachable from the thin film deposition apparatus 100. A conventional FMM deposition method has low deposition efficiency. Deposition efficiency refers to the ratio of a deposition material deposited on a substrate to the deposition material vaporized from a deposition source. The conventional FMM deposition method has a deposition efficiency of about 32%. Furthermore, in the conventional FMM deposition method, about 68% of organic deposition material that is not deposited on the substrate remains adhered to a deposition apparatus, and thus reusing the deposition material is not easily achieved.

In order to overcome these and/or other problems, in the thin film deposition apparatus 100, the deposition space is enclosed by using the first barrier wall assembly 130, so that the deposition material 115 that remains undeposited is mostly deposited within the first barrier wall assembly 130. Thus, when a large amount of the deposition material 115 lies in the first barrier wall assembly 130 after a long deposition process, the first barrier wall assembly 130 may be detached from the thin film deposition apparatus 100 and then placed in a separate deposition material recycling apparatus to recover the deposition material 115. Due to the structure of the thin film deposition apparatus 100, a reuse ratio of the deposition material 115 is increased, so that the deposition efficiency is improved, whereas the manufacturing costs are reduced.

The second barrier wall assembly 140 is disposed at a side of the first barrier wall assembly 130. The second barrier wall assembly 140 includes a plurality of second barrier walls 141, and a second barrier wall frame 142 that covers sides of the second barrier walls 142. The plurality of second barrier walls 141 may be arranged parallel to each other at equal intervals in the Y-axis direction. In addition, each of the second barrier walls 141 may be formed to extend along an XZ plane in FIG. 8, i.e., perpendicular to the Y-axis direction. The plurality of second barrier walls 141 arranged as described above partition the deposition space between the first nozzle 120 and the second nozzle 150. In the thin film deposition apparatus 100, the deposition space is divided by the first barrier walls 131 and second barrier walls 141, which will be described later, into sub-deposition spaces that respectively correspond to the first slits 121 through which the deposition material 115 is discharged.

The second barrier wall frame 142 may be formed in a lattice shape, similar to a window frame. The second barrier walls 141 are arranged within the second barrier wall frame 142. The second barrier wall frame 142 supports the second barrier walls 141, and guides the deposition material 115, which is discharged through the first slits 121, not to flow in the Z-axis direction.

The deposition space between the first and second nozzles 120 and 150 is divided by the first and second barrier wall assemblies 130 and 140 but the present invention is not limited thereto. For example, the deposition space between the first and second nozzles 120 and 150 may be divided by only the first barrier wall assembly 130. That is, the second barrier wall assembly 140 may not be formed. However, the deposition space between the first and second nozzles 120 and 150 may be more efficiently divided when both the first and second barrier wall assemblies 130 and 150 are used than when only the first barrier wall assembly 130 is used.

Referring to FIGS. 1 to 3, the second barrier walls 141 may be disposed to correspond to the first barrier walls 131. In other words, the second barrier walls 141 may be aligned with the first barrier walls 131 to be parallel with each other. That is, each pair of the corresponding first and second barrier walls 131 and 141 may be located on the same plane. As described above, since the deposition space between the first nozzle 120 and the second nozzle 150, which will be described later, is partitioned by the first barrier walls 131 and the second barrier walls 141, which are disposed parallel to each other, the deposition material 115 discharged through each of the first slits 121 is not mixed with the deposition material 115 discharged through the other first slits 121, and is deposited on the substrate 160 through the second slits 151. The first barrier walls 131 and the second barrier walls 141 guide the deposition material 115, which is discharged through the first slits 121, not to flow in the Y-axis direction.

Although the first barrier walls 131 and the second barrier walls 141 are respectively illustrated as having the same thickness in the Y-axis direction, aspects of the present invention are not limited thereto. The second barrier walls 141, which should be accurately aligned with the second nozzle 150, may be formed to be relatively thin, whereas the first barrier walls 131, which do not need to be precisely aligned with the second nozzle 150, may be formed to be relatively thick. This makes it easier to manufacture the thin film deposition apparatus 100.

The second nozzle 150 and the second nozzle frame 155 are disposed between the deposition source 110 and the substrate 160. The second nozzle frame 155 may be formed in a lattice shape, similar to a window frame. The second nozzle 150 is bound inside the second nozzle frame 155. The second nozzle 150 includes a plurality of second slits 151 that may be arranged at equal intervals in the Y-axis direction. The deposition material 115 that is vaporized in the deposition source 110 passes through the first nozzle 120 and the second nozzle 150 towards the substrate 160.

A plurality of second nozzle reinforcement units 153 are disposed on a bottom surface of the second nozzle 150, i.e., a surface of the second nozzle 150 facing away from the substrate 160. Referring to FIGS. 2 and 3, the second nozzle reinforcement units 153 are disposed on a surface of the second nozzle 150, which faces the deposition source 110. The second nozzle reinforcement units 153 will be described in detail later.

In the thin film deposition apparatus 100, the total number of second slits 151 may be greater than the total number of first slits 121. In addition, there may be a greater number of second slits 151 than first slits 121 disposed between two adjacent first barrier walls 131.

That is, at least one first slit 121 may be disposed between each two adjacent first barrier walls 131. Similarly, a plurality of second slits 151 may be disposed between each two adjacent first barrier walls 131. The deposition space between the first nozzle 120 and the second nozzle 150 is partitioned by the first barrier walls 131 into sub-deposition spaces that correspond to the first slits 121, respectively. Accordingly, the deposition material 115 discharged from one first slit 121 mostly passes through the second slits 151 in the same deposition space and is then deposited on the substrate 160.

Although one first slit 121 corresponds to three second slits 151 in FIG. 3, aspects of the present invention are not limited thereto. A ratio of the number of second slits 151 to the number of the first slits 121 may vary according to the requirements of a product to be manufactured.

The second nozzle 150 may be manufactured by etching, which is the same method as used in a conventional method of manufacturing an FMM, and in particular, a striped FMM. In the conventional FMM deposition method, the size of the FMM has to be equal to the size of a substrate. Thus, the size of the FMM has to be increased as the substrate becomes larger. However, it is neither straightforward to manufacture a large FMM nor to extend an FMM to be accurately aligned with a pattern. However, in the thin film deposition apparatus 100, deposition is performed while the thin film deposition apparatus 100 is moved in the Z-axis direction within the chamber (not shown). In other words, once the thin film deposition apparatus 100 has completed deposition at a current location, either the thin film deposition apparatus 100 or the substrate 160 is moved relative to each other in the Z-axis direction for further continuous deposition. Thus, in the thin film deposition apparatus 100, the second nozzle 150 may be significantly smaller than an FMM used in a conventional deposition method. In the thin film deposition apparatus 100, the length of the second nozzle 150 in the Z-axis direction may be less than the length of the substrate 160 in the Z-axis direction, provided that the width of the second nozzle 150 in the Y-axis direction is equal to the width of the substrate 160 in the Y-axis direction. As described above, since the second nozzle 150 may be formed to be significantly smaller than an FMM used in a conventional deposition method, it is relatively easy to manufacture the second nozzle 150. The use of the second nozzle 150, which is smaller than a FMM used in a conventional deposition method, is more convenient in all processes, including etching and subsequent other processes, such as precise extension, welding, moving, and cleaning processes, compared to the conventional deposition method using the larger FMM. This is more advantageous for a relatively large display device.

Figure 4:
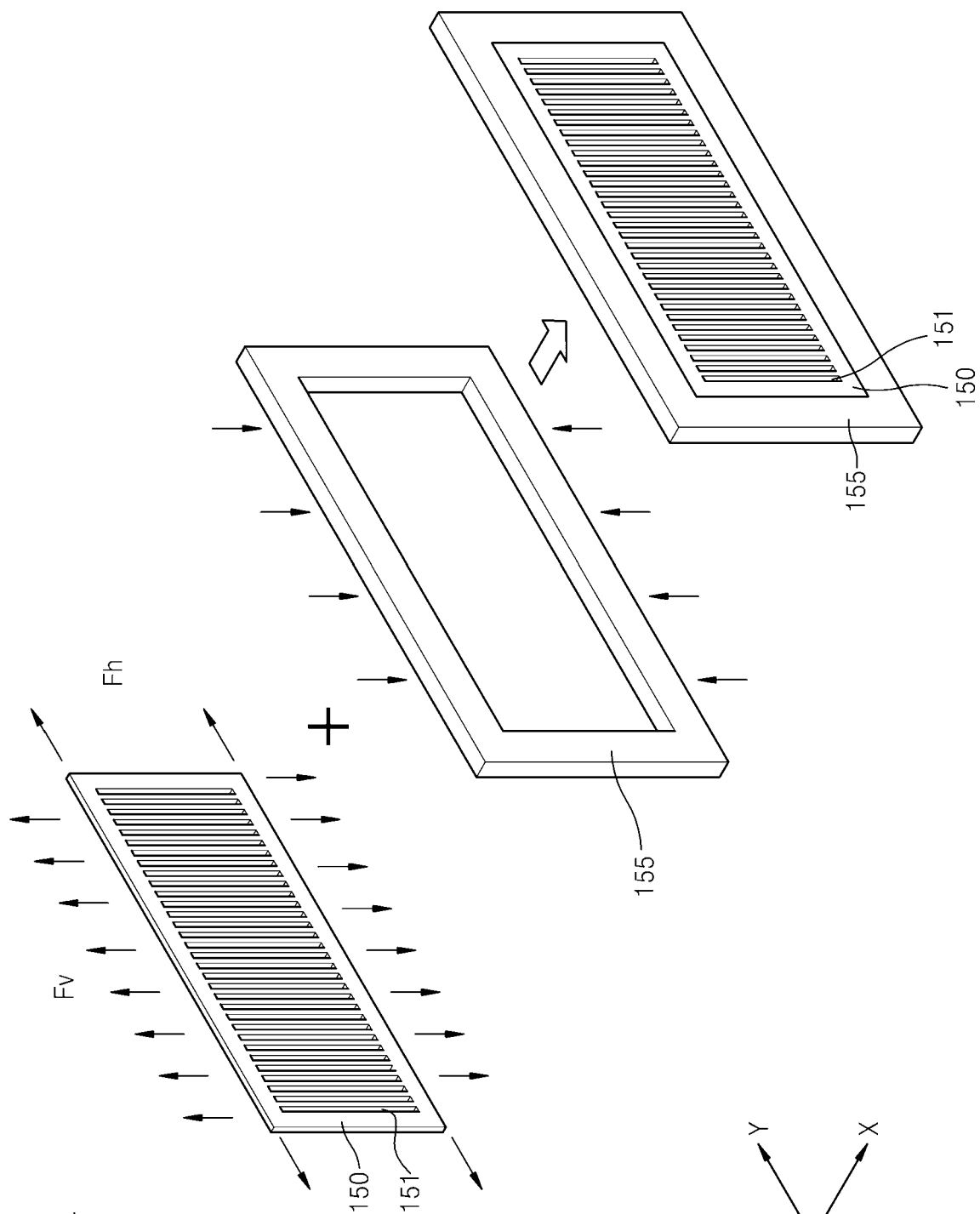
FIG. 4 is a schematic perspective view illustrating a binding structure of a second nozzle and a second nozzle frame included in the thin film deposition apparatus of FIG. 1, according to an embodiment of the present invention.

FIG. 4 is a schematic perspective view illustrating a binding structure of the second nozzle 150 and the second nozzle frame 155 included in the thin film deposition apparatus 100 of FIG. 1, according to an embodiment of the present invention.

The second nozzle 150 is formed in a thin film and may be fixed in the thin film deposition apparatus 100 via the second nozzle frame 155

Referring to FIG. 4, the second nozzle frame 155 may be formed in a lattice shape, similar to a window frame. The second nozzle 150 including the plurality of second slits 151 is bound inside the second nozzle frame 155. While the thin film deposition apparatus 100 is manufactured, the second nozzle 150 is bound to the second nozzle frame 155 such that a tensile force is exerted on the second nozzle 150 by the second nozzle frame 155.

In particular, a pattern precision of the second nozzle 150 may be affected by a manufacturing error and a thermal expansion error during deposition of the second nozzle 150. In order to minimize manufacturing errors of the second nozzle 150, a counter force technique used to precisely extend an FMM and weld it to a frame may be used. This will now be described in detail below. Initially, as illustrated in FIG. 4, an external tensile force is applied to the second nozzle 150 so that the second nozzle 150 is stretched outwards. Next, a compression force is applied to the second nozzle frame 155 in an opposite direction to the direction in which the external tensile force is applied to the second nozzle 150, such that the compression force is in equilibrium with the external tensile force applied to the second nozzle 150. Then, the second nozzle 150 is bound to the second nozzle frame 155 by, for example, welding edges of the second nozzle 150 to the second nozzle frame 155. Finally, the second nozzle 150 and the second nozzle frame 155 are relieved from all the external forces applied thereto to reach equilibrium, so that only a tensile force is exerted on the second nozzle 150 by the second nozzle frame 155. When such precise extension, compression, and welding techniques as described above are used, the second nozzle 150 may be manufactured with a manufacturing error of 2 μm or less.

In the thin film deposition apparatus 100, the temperature of the second nozzle frame 150 may be maintained constant. In particular, the second nozzle 150, which is disposed to face the deposition source 110 whose temperature is high, is always exposed to radiant heat from the deposition source 110, so that the temperature of the second nozzle 150 is increased to some extent, for example, by about 5 to about 15° C. However, when the temperature of the second nozzle 150 is increased, the second nozzle 150 may expand, thus deteriorating a pattern precision of the second nozzle 150. In order to overcome this and/or other problems, according to an aspect of the present invention, the second nozzle 150, which is a stripe type nozzle, is used and the temperature of the second nozzle frame 155, which supports the second nozzle 150 such that a tensile force is exerted on the second nozzle 150, is maintained constant, thereby preventing pattern errors due to a temperature increase of the second nozzle 150.

The thermal expansion (pattern error) of the second nozzle 150 in a horizontal direction (Y-axis direction) is affected by the temperature of the second frame nozzle 155. Thus, if the temperature of the second nozzle frame 155 is maintained constant, such an error in the pattern of the second nozzle 150 caused due to the thermal expansion does not occur even when the temperature of the second nozzle 150 rises. Although the second nozzle 150 thermally expands in a vertical direction (Z-axis direction), the vertical direction of the second nozzle 150 is a scanning direction that is irrelevant to the pattern precision of the second nozzle 150.

The second nozzle frame 155 does not directly face the deposition source 110 in a vacuum condition and is thus not exposed to the radiant heat from the deposition source 110. In addition, since the second nozzle frame 155 is not connected to the deposition source 110, there is no thermal conduction between the deposition source 110 and the second nozzle frame 155. Thus, the temperature of the second nozzle frame 155 is unlikely to rise. Even if the temperature of the second nozzle frame 155 rises slightly, for example, by 1 to 3° C., the temperature of the second nozzle frame 155 may be easily maintained constant via a thermal shield or a radiation fin.

As described above, as the second nozzle frame 155 exerts a tensile force on the second nozzle 150 and the temperature of the second nozzle frame 155 is maintained constant, the thermal extension problem with the second nozzle 150 no longer affects a problem of pattern precision of the second nozzle 150. Thus, the pattern precision of the second nozzle 150 may be further improved. When precise extension, compression, and welding techniques are used as described above, the second nozzle 150 may be manufactured with a manufacturing error of 2 μm or less. In addition, an error in the pattern of the second nozzle 150 caused by the thermal expansion of the second nozzle 150, which occurs as the temperature of the second nozzle 150 rises, may be prevented by supporting the second nozzle 150 such that a tensile force is exerted thereon and by maintaining the temperature of the second nozzle frame 155 to be constant. Thus, the second nozzle 150 may be manufactured with an error of less than 2 μm, which is attributed to a manufacturing error (<2) of the second nozzle 150 and a thermal expansion error (~0) of the second nozzle 150.

In the thin film deposition apparatus 100, the first barrier wall assembly 130 and the second barrier wall assembly 140 may be disposed to be separated from each other by a predetermined distance. The first barrier wall assembly 130 and the second barrier wall assembly 140 are separated from each other for the following reasons.

The second barrier walls 141 and the second nozzle 150 should be precisely aligned with each other, whereas it is unnecessary to precisely align the first barrier walls 131 and the second barrier walls 141. Thus, high-precision control may be easily achieved by separating a part required to be precisely controlled from a part not required to be precisely controlled.

In addition, the second barrier walls 141 and the second nozzle 150 should be aligned with the substrate 160 to be accurate in position and to have a constant interval therebetween, and thus may require high-precision control. Thus, in order to make it easy to control such parts that require high-precision control, the second barrier wall assembly 140 and the second nozzle 150 are separated from the deposition source 110, the first nozzle 120, and the first barrier wall assembly 130, which are relatively heavy parts not requiring precise control.

Additionally, the temperature of the first barrier wall assembly 130 may increase to 100° C. or higher due to the high temperature of the deposition source 110. In order to prevent the heat of the first barrier wall assembly 130 from being conducted to the second barrier wall assembly 140 and the second nozzle 150, the first barrier wall assembly 130 and the second barrier wall assembly 140 are separated from each other.

Furthermore, when the second nozzle 150 is separated from the chamber, it may be easier to separate both the second nozzle 150 and the second barrier wall assembly 140 together than to separate only the second nozzle 150. In order to make it easier to separate the second nozzle 150 and the second barrier wall assembly 140 together from the chamber, the first barrier wall assembly 130 and the second barrier wall assembly 140 are separated from each other.

Moreover, in the thin film deposition apparatus 100, the deposition material 115 adhered to the first barrier wall assembly 130 is mostly reused, whereas the deposition material 115 adhered to the second barrier wall assembly 140 and the second nozzle 150 may not be reused. Thus, when the first barrier wall assembly 130 is separated from the second barrier wall assembly 140 and the second nozzle 150, it may be easier to recover the deposition material 115 to be reused.

Furthermore, a calibration plate (not shown) may be further installed in order to ensure uniformity of a thin layer over the entire substrate 160. When the first barrier wall assembly 130 is separated from the second barrier wall assembly 140, it is very simple to install the calibration plate.

Lastly, a partition (not shown) may be further installed in order to prevent deposition of the deposition material 115 on the second nozzle 150 after deposition onto the substrate 160 has been completed and before another target substrate is subjected to deposition. This may extend a nozzle exchange cycle. It is straightforward to install the partition between the first barrier walls 131 and the second barrier walls 141. To this end, the first barrier wall assembly 130 and the second barrier wall assembly 140 are separated from each other.

Figure 5:
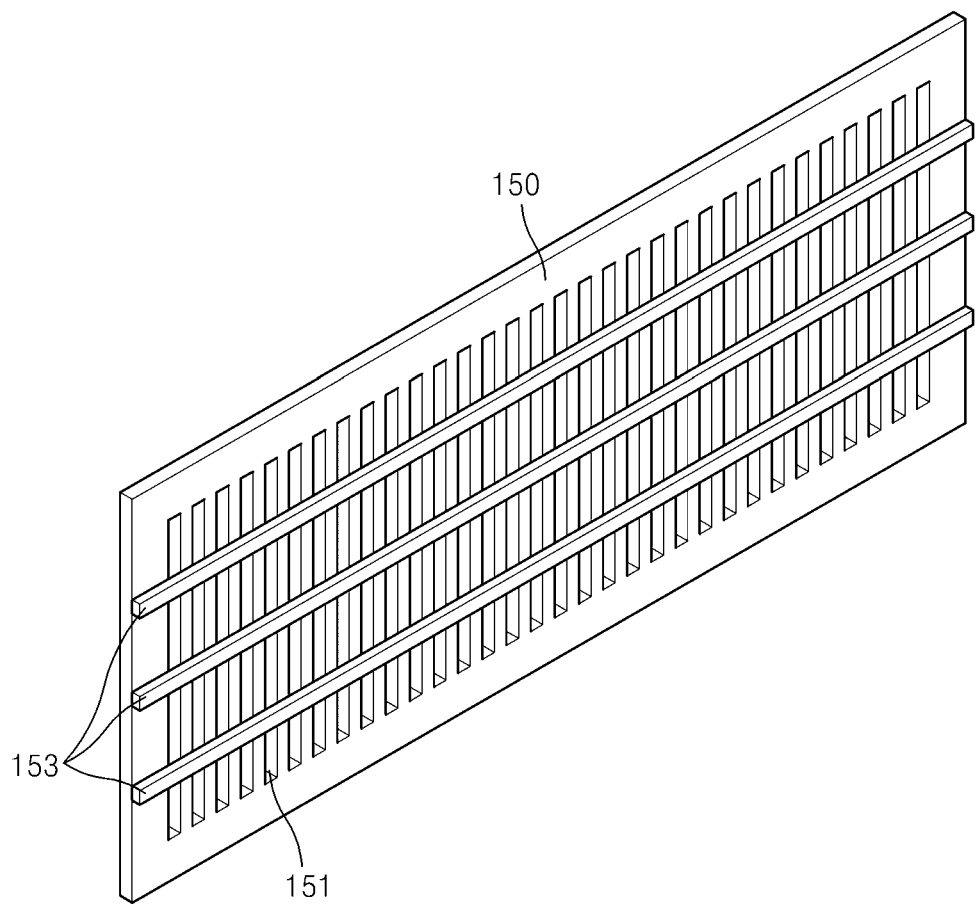
FIG. 5 is a schematic perspective view of the second nozzle and a plurality of second nozzle reinforcement units included in the thin film deposition apparatus of FIG. 1, according to an embodiment of the present invention.

FIG. 5 is a schematic perspective view of the second nozzle 150 and the plurality of second nozzle reinforcement units 153 included in the thin film deposition apparatus 100 of FIG. 1, according to an embodiment of the present invention. Referring to FIG. 5, the second nozzle reinforcement units 153 are disposed at the bottom surface of the second nozzle 150 to contact the second nozzle 150. The second nozzle reinforcement units 153 may cross the second slits 151 of the second nozzle 150. That is, the second nozzle reinforcement units 153 may extend in a direction along which the second slits 151 are disposed.

The second nozzle reinforcement units 153 are disposed on a surface of the second nozzle 150 facing away from the substrate 160 as illustrated in FIGS. 2 and 3 in order to prevent the substrate 160 from being scratched by the second nozzle reinforcement units 153 when contacting the second nozzle reinforcement units 153 during deposition.

The second nozzle reinforcement units 153 prevent oscillation of the second nozzle 150 when contacting the second nozzle 150. The second slits 151 of the second nozzle 150 are each long and narrow. Thus, the second nozzle 150 is likely to oscillate during deposition. In detail, the second nozzle 150 performs harmonic oscillation having a unique number of oscillation. When the second nozzle 150 oscillates, the pattern of the second slits 151 of the second nozzle 150 changes, thereby preventing a desired deposition pattern from being obtained.

The oscillation of the second nozzle 150 is prevented by disposing the second nozzle reinforcement units 153 on the bottom surface of the second nozzle 150. In particular, if the second nozzle reinforcement units 153 having a value different from the unique number of oscillation of the second nozzle 150 contacts the second nozzle 150, then the second nozzle reinforcement units 153 may support the second nozzle 150 and effectively prevent the oscillation of the second nozzle 150. Accordingly, the pattern precision may be improved.

In FIG. 5, three second nozzle reinforcement units 153 are illustrated but the present invention is not limited thereto. For example, only one second nozzle reinforcement unit 153 may be used or two or at least four second nozzle reinforcement units 153 may be used.

The second nozzle reinforcement units 153 may be thin and long. Thus, regions of the second nozzle 150 in which the second slits 151 are covered by the second nozzle reinforcement units 153 may be minimized in size. In FIG. 5, the second nozzle reinforcement units 153 are perpendicular to the lengthwise direction of the second slits 151 of the second nozzle 150 but the present invention is not limited thereto and an angle formed by each of the second nozzle reinforcement units 153 and the second slits 151 may vary as long as the second slits 151 of the second nozzle 150 crosses all the second slits 151.

Figure 6:
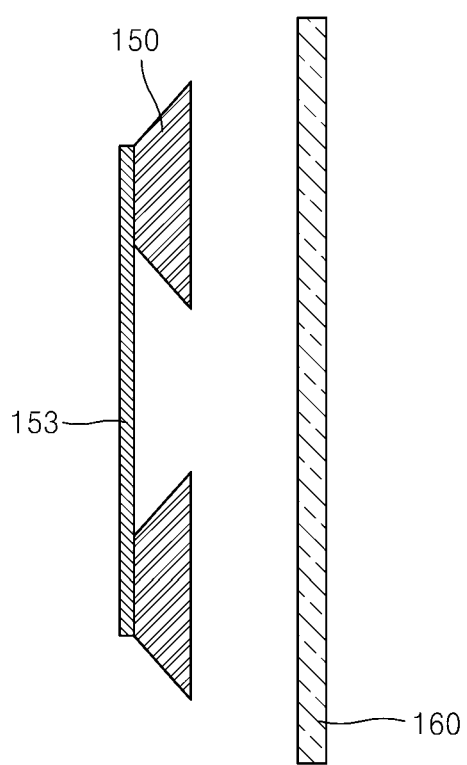
FIG. 6 is a perspective view illustrating in detail the relationship between the second nozzle and each of the second nozzle reinforcement units, according to an embodiment of the present invention.

FIG. 6 is a perspective view illustrating in detail the relationship between the second nozzle 150 and each of the second nozzle reinforcement units 153, according to an embodiment of the present invention. The second nozzle 150 and the second nozzle reinforcement unit 153 are partially illustrated in FIG. 6 for convenience of explanation. It would also be understood that FIG. 6 is a view of a portion of the thin film deposition apparatus 100 illustrated in FIG. 3. Referring to FIG. 6, the second nozzle reinforcement unit 153 is disposed on the bottom surface of the second nozzle 150 to support the second nozzle 150. The second nozzle reinforcement unit 153 may prevent distortion of the second nozzle 150 when the second nozzle 150 oscillates.

A process of depositing a deposition material in a thin film deposition apparatus according to an embodiment of the present invention will now be described briefly.

Referring to FIG. 2, the deposition material 115 that has been vaporized in the deposition source 110 is deposited on the substrate 160 while passing through the first nozzle 120 and the second nozzle 150. Since the deposition space between the first nozzle 120 and the second nozzle 150 is partitioned by the first barrier wall assembly 130 and the second barrier wall assembly 140, the deposition material 115 discharged through each of the first slits 121 of the first nozzle 120 is not mixed with the deposition material 115 discharged through the other adjacent first slits 121 owing to the first barrier wall assembly 130 and the second barrier wall assembly 140.

When the deposition space between the first nozzle 120 and the second nozzle 150 is partitioned by the first and second barrier wall assemblies 130 and 140, the deposition material 115 is deposited on the substrate 160 while passing through the second nozzle 150 at an angle that is substantially perpendicular to the substrate 160.

A shadow zone formed on the substrate 160 may be reduced by installing the first and second barrier wall assemblies 130 and 140. Thus, the second nozzle 150 may be separated from the substrate 160.

More specifically, in the thin film deposition apparatus 100 according to aspects of the present invention, the second nozzle 150 may be separated from the substrate 160 by a predetermined distance. In a conventional deposition method using an FMM, deposition is performed with the FMM in close contact with a substrate in order to prevent formation of a shadow zone on the substrate. However, when the FMM is used in close contact with the substrate, the contact may cause defects. In order to solve this problem, in the thin film deposition apparatus 100, the second nozzle 150 is disposed to be separated from the substrate 160 by a predetermined distance. This may be implemented by installing the first and second barrier wall assemblies 130 and 140 to reduce the width of the shadow zone formed on the substrate 160.

As described above, according to aspects of the present invention, it is possible to prevent a defect caused by the contact between a substrate and an FMM, which occurs in a conventional deposition method. In addition, since it is unnecessary to use the FMM in close contact with the substrate during a deposition process, the manufacturing speed may be improved.

In addition, when the second barrier wall frame 142 is separate from and is combined to the second nozzle frame 155, the second barrier wall frame 142 and the second nozzle frame 155 may be aligned precisely with each other, thereby maintaining the second barrier walls 141 and the second nozzle 150 to be aligned precisely with each other.

Figure 7:
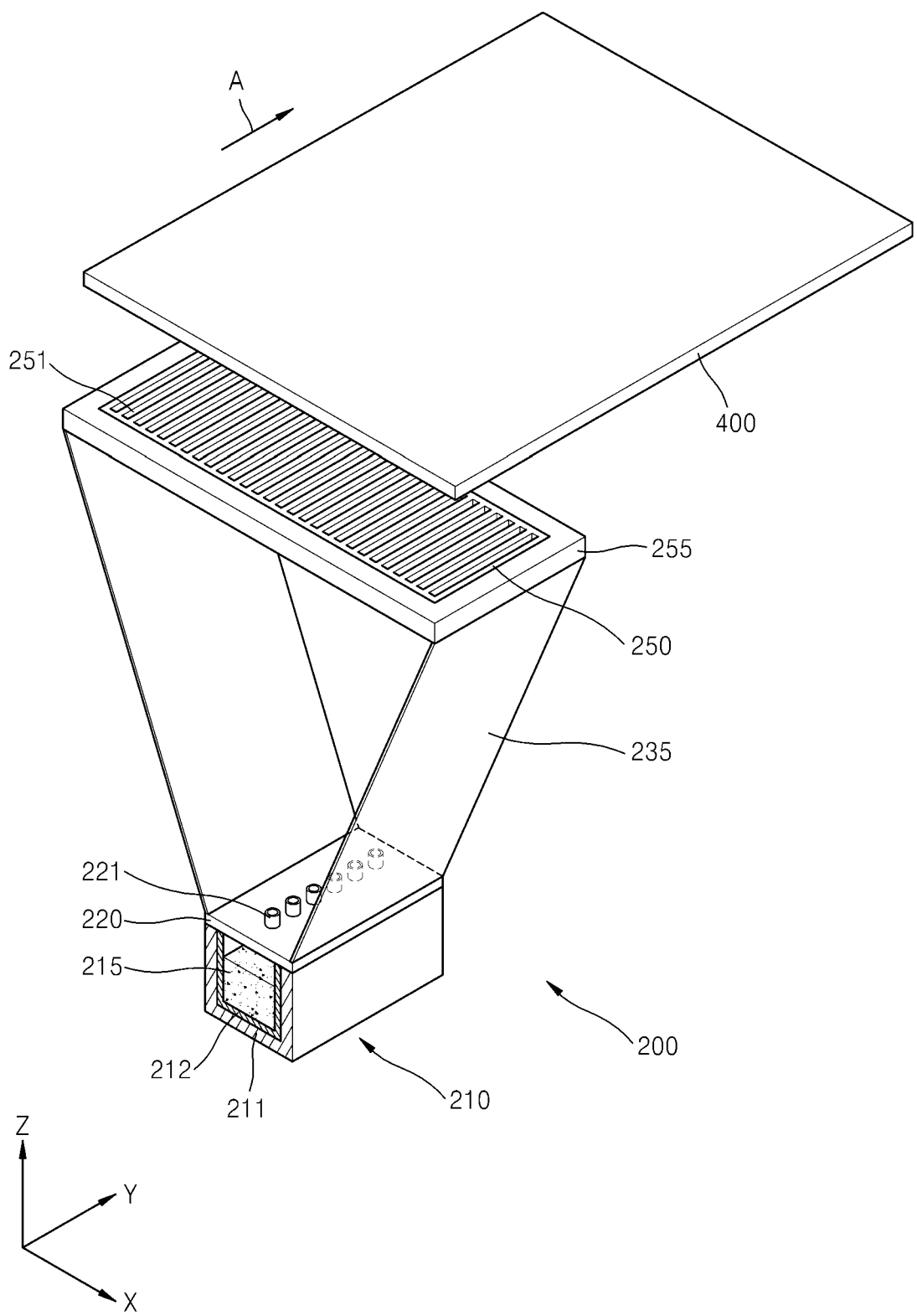
FIG. 7 is a schematic perspective view of a thin film deposition apparatus according to an embodiment of the present invention.
Figure 8:
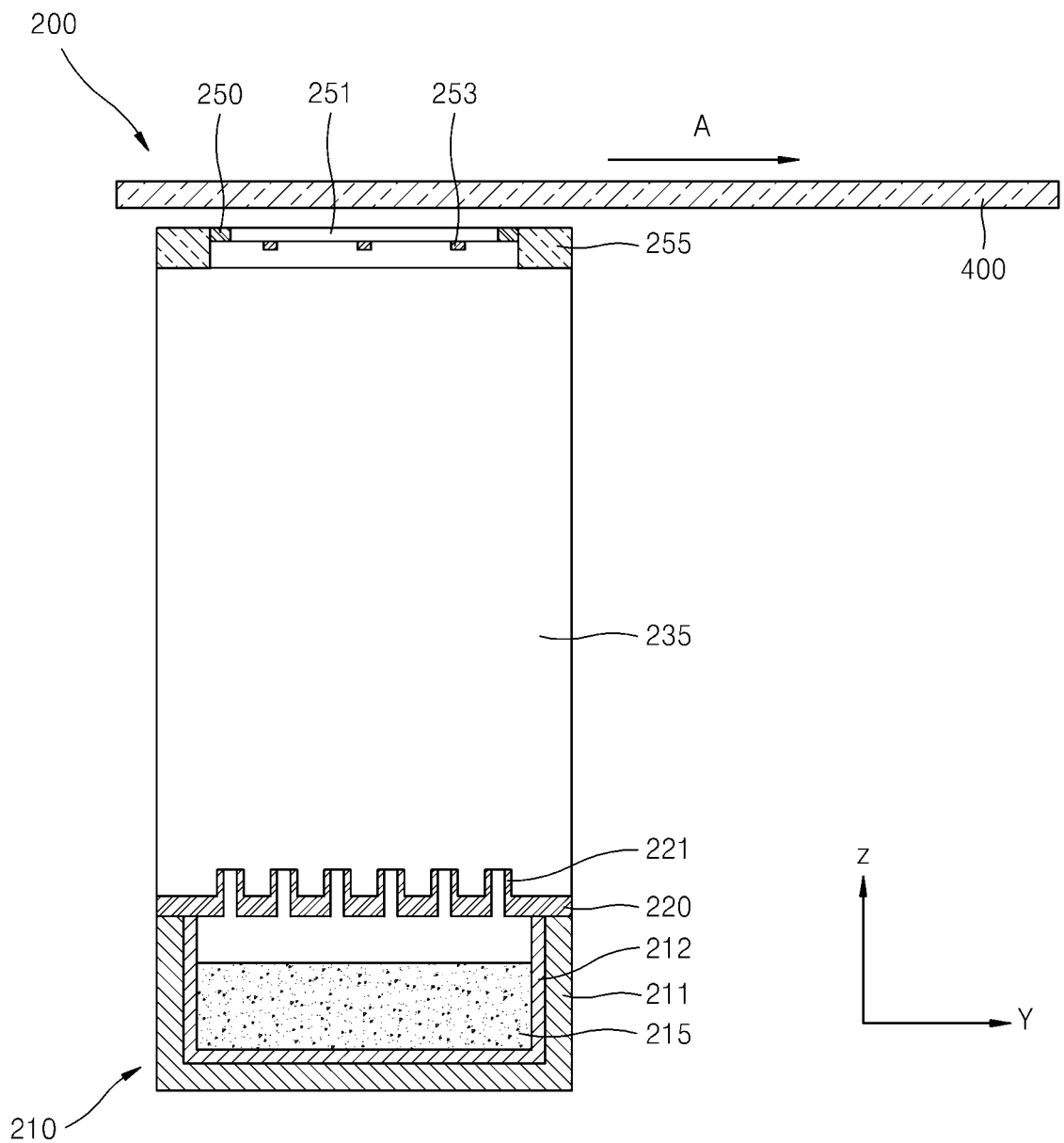
FIG. 8 is a schematic side view of the thin film deposition apparatus of FIG. 7, according to an embodiment of the present invention.
Figure 9:
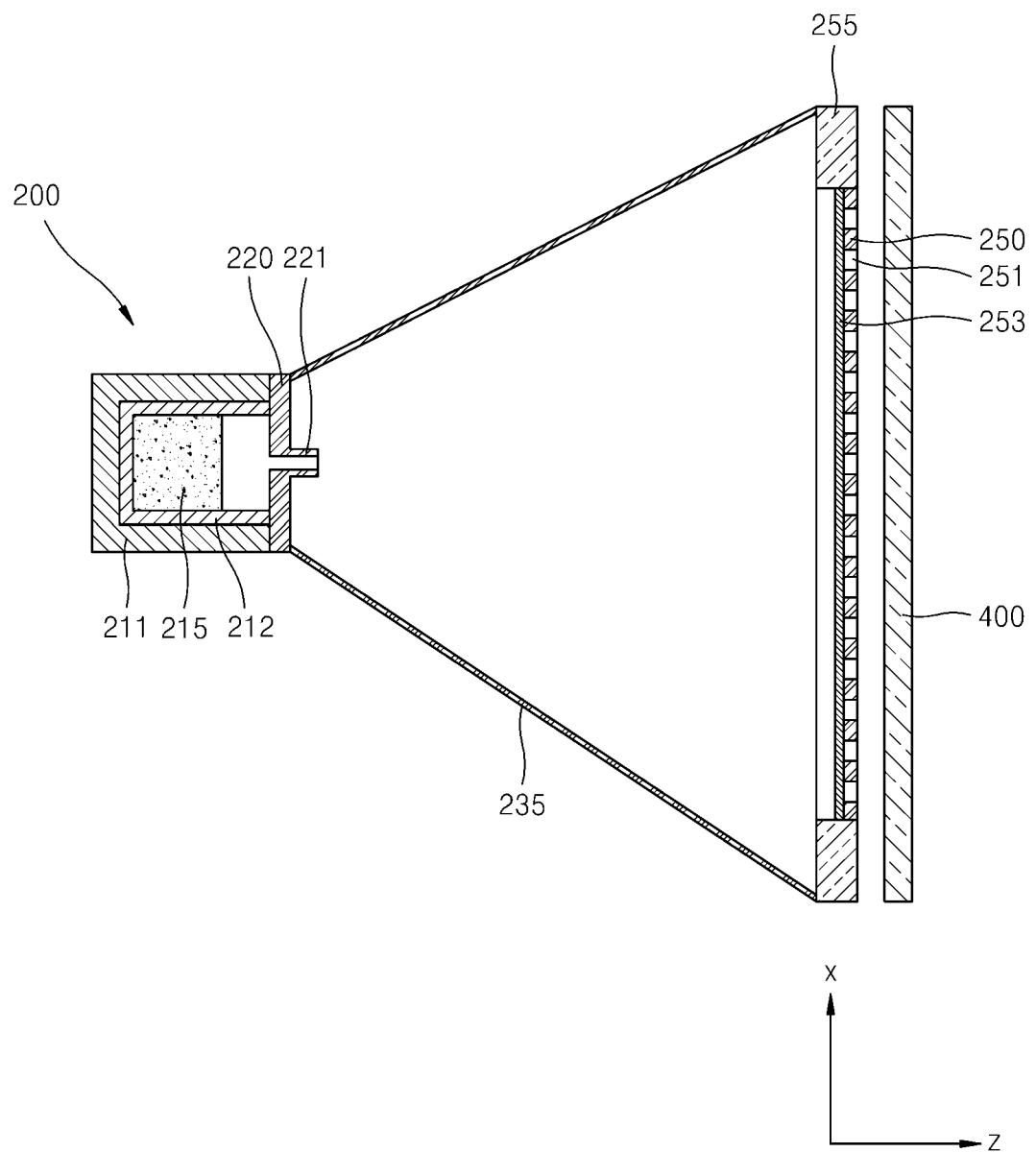
FIG. 9 is a schematic plan view of the thin film deposition apparatus of FIG. 7, according to an embodiment of the present invention.

FIG. 7 is a schematic perspective view of a thin film deposition apparatus 200 according to an embodiment of the present invention. FIG. 8 is a schematic side view of the thin film deposition apparatus 200 of FIG. 7, according to an embodiment of the present invention. FIG. 9 is a schematic plan view of the thin film deposition apparatus 200 of FIG. 7, according to an embodiment of the present invention.

Referring to FIGS. 7 to 9, the thin film deposition apparatus 200 includes a deposition source 210, a first nozzle 220, a second nozzle 250, and a plurality of second nozzle reinforcement units 253. Although not illustrated in FIGS. 7 to 9 for convenience of explanation, all the components of the thin film deposition assembly 200 may be disposed within a chamber that is maintained at an appropriate degree of vacuum. The chamber is maintained at an appropriate vacuum in order to allow a deposition material 215 to move in a substantially straight line through the thin film deposition apparatus 200.

In order to deposit the deposition material 215 emitted from the deposition source 210 and discharged through the first nozzle 220 and the second nozzle 250 on a substrate 400 in a desired pattern, the chamber should be maintained in a high-vacuum state as in a deposition method using a fine metal mask (FMM). In addition, the temperature of the second nozzle 250 has to be sufficiently lower than the temperature of the deposition source 210. In this regard, the temperature of the second nozzle 250 may be about 100° C. or less. The temperature of the second nozzle 250 should be sufficiently low so as to reduce thermal expansion thereof.

The substrate 400 that is a deposition target substrate is disposed in the chamber. The substrate 400 may be a substrate for flat panel displays. A large substrate, such as a mother glass, for manufacturing a plurality of flat panel displays, may be used as the substrate 400. Other substrates may also be employed.

Deposition is performed while the substrate 400 is moved relative to the thin film deposition assembly 200. In other words, deposition is continuously performed while the substrate 400 disposed to face the thin film deposition assembly 200 is moved in a Y-axis direction. That is, deposition is performed in a scanning manner while the substrate 400 is moved in a direction of arrow A in FIG. 7. Although the substrate 400 is illustrated as being moved in the Y-axis direction in FIG. 7 when deposition is performed, the present invention is not limited thereto and deposition may be performed while the thin film deposition apparatus 200 is moved in the Y-axis direction, whereas the substrate 400 is fixed.

Thus, in the thin film deposition apparatus 200, the second nozzle 250 may be significantly smaller than an FMM used in a conventional deposition method. That is, in the thin film deposition assembly 200, deposition is continuously performed, i.e., in a scanning manner, while the substrate 400 is moved in the Y-axis direction. Thus, lengths of the second nozzle 250 in the X-axis and Y-axis directions may be significantly less than the lengths of the substrate 400 in the X-axis and Y-axis directions. As described above, since the second nozzle 250 may be formed to be significantly smaller than an FMM used in a conventional deposition method, it is relatively easy to manufacture the second nozzle 250. The use of the second nozzle 250, which is smaller than an FMM used in a conventional deposition method, is more convenient in all processes, including etching and subsequent other processes, such as precise extension, welding, moving, and cleaning processes, compared to the conventional deposition method using the larger FMM. Therefore, the second nozzle 250 is more advantageous than an FMM when used for a relatively large display device.

In order to perform deposition while the thin film deposition assembly 200 or the substrate 400 is moved relative to each other as described above, the thin film deposition assembly 200 and the substrate 400 may be separated from each other by a predetermined distance.

The deposition source 210 that contains and heats the deposition material 215 is disposed in an opposite side of the chamber to that in which the substrate 400 is disposed. The deposition source 210 includes a crucible 211 that is filled with the deposition material 215, and a heater 212 for heating the crucible 211.

The first nozzle 220 is disposed at a side of the deposition source 210 facing the substrate 400. The first nozzle 220 includes a plurality of first slits 221 that may be arranged at equal intervals in the Y-axis direction, i.e., a scanning direction of the substrate 400. The deposition material 215 that is vaporized in the deposition source 210 passes through the first nozzle 220 towards the substrate 400. As described above, if the plurality of first slits 221 are formed in the first nozzle 220 along the Y-axis direction, i.e., the scanning direction of the substrate 400, then a size of a pattern formed by the deposition material 215 that is discharged through each of the second slits 251 of the second nozzle 250 is only affected by the size of one first slit 221 (that is, it may be considered that one first slit 221 exists in the X-axis direction), thereby preventing a shadow zone from being formed on the substrate. In addition, since the plurality of first slits 221 are formed in the scanning direction of the substrate 400, even if there is the difference between fluxes of the first slits 221, the difference may be compensated for and deposition uniformity may be maintained constant.

The second nozzle 250 and the second nozzle frame 255 are disposed between the deposition source 210 and the substrate 400. The second nozzle frame 255 may be formed in a lattice shape, similar to a window frame. The second nozzle 250 is bound inside the second nozzle frame 255. The second nozzle 250 includes a plurality of second slits 251 that may be arranged at equal intervals in the X-axis direction. The deposition material 215 that is vaporized in the deposition source 210 passes through the first nozzle 220 and the second nozzle 250 towards the substrate 400. The second nozzle 250 may be manufactured by etching, which is the same method as used in a conventional method of manufacturing an FMM, and in particular, a striped FMM. Here, the total number of second slits 251 may be greater than the total number of first slits 221.

The second nozzle reinforcement units 253 are disposed on a bottom surface of the second nozzle 250, i.e., a surface of the second nozzle 250 facing away from the substrate 400. Referring to FIGS. 8 and 9, the second nozzle reinforcement units 253 are disposed on a surface of the second nozzle 250 facing the deposition source 210. The structure of the second nozzle reinforcement units 253 is the same as that of the second nozzle reinforcement units 153 illustrated in FIGS. 5 and 6.

The deposition source 210 (and the first nozzle 220 coupled to the deposition source 210) and the second nozzle 250 may be formed to be separated from each other by a predetermined distance. Alternatively, the deposition source 210 (and the first nozzle 220 coupled to the deposition source 210) and the second nozzle 250 may be connected by a plurality of connection units 235. That is, the deposition source 210, the first nozzle 220, and the second nozzle 250 may be formed integrally with one another by being connected to each other via the connection units 235. The connection units 235 may guide the deposition material 215, which is discharged through the first slits 221, to move straight, not to flow in the X-axis direction. In FIGS. 7 through 9, the connection units 235 are formed on left and right sides of the deposition source 210, the first nozzle 220, and the second nozzle 250 to guide the deposition material 215 to flow in the X-axis direction but the present invention is not limited thereto and the connection unit 235 may be formed as a sealed type of a box shape to guide flow of the deposition material 115 in the X-axis and Y-axis directions.

As described above, the thin film deposition apparatus 200 performs deposition while being moved relative to the substrate 400. In order to move the thin film deposition apparatus 200 relative to the substrate 400, the second nozzle 250 is separated from the substrate 400 by a predetermined distance.

In particular, in a conventional deposition method using an FMM, deposition is performed with the FMM in close contact with a substrate in order to prevent formation of a shadow zone on the substrate. However, when the FMM is used in close contact with the substrate, the contact may cause defects. In addition, in the conventional deposition method, the size of the mask has to be the same as the size of the substrate since the mask cannot be moved relative to the substrate. Thus, the size of the mask has to be increased as display devices become larger. However, it is not easy to manufacture such a large mask.

In order to overcome this problem, in the thin film deposition apparatus 200, the second nozzle 250 is disposed to be separated from the substrate 400 by a predetermined distance.

As described above, according to an aspect of the present invention, a mask is formed to be smaller than a substrate, and deposition is performed while the mask is moved relative to the substrate. Thus, the mask can be easily manufactured. In addition, defects caused due to the contact between a substrate and an FMM, which occurs in the conventional deposition method, may be prevented. In addition, since it is unnecessary to use the FMM in close contact with the substrate during a deposition process, the manufacturing speed may be improved.

Figure 10:
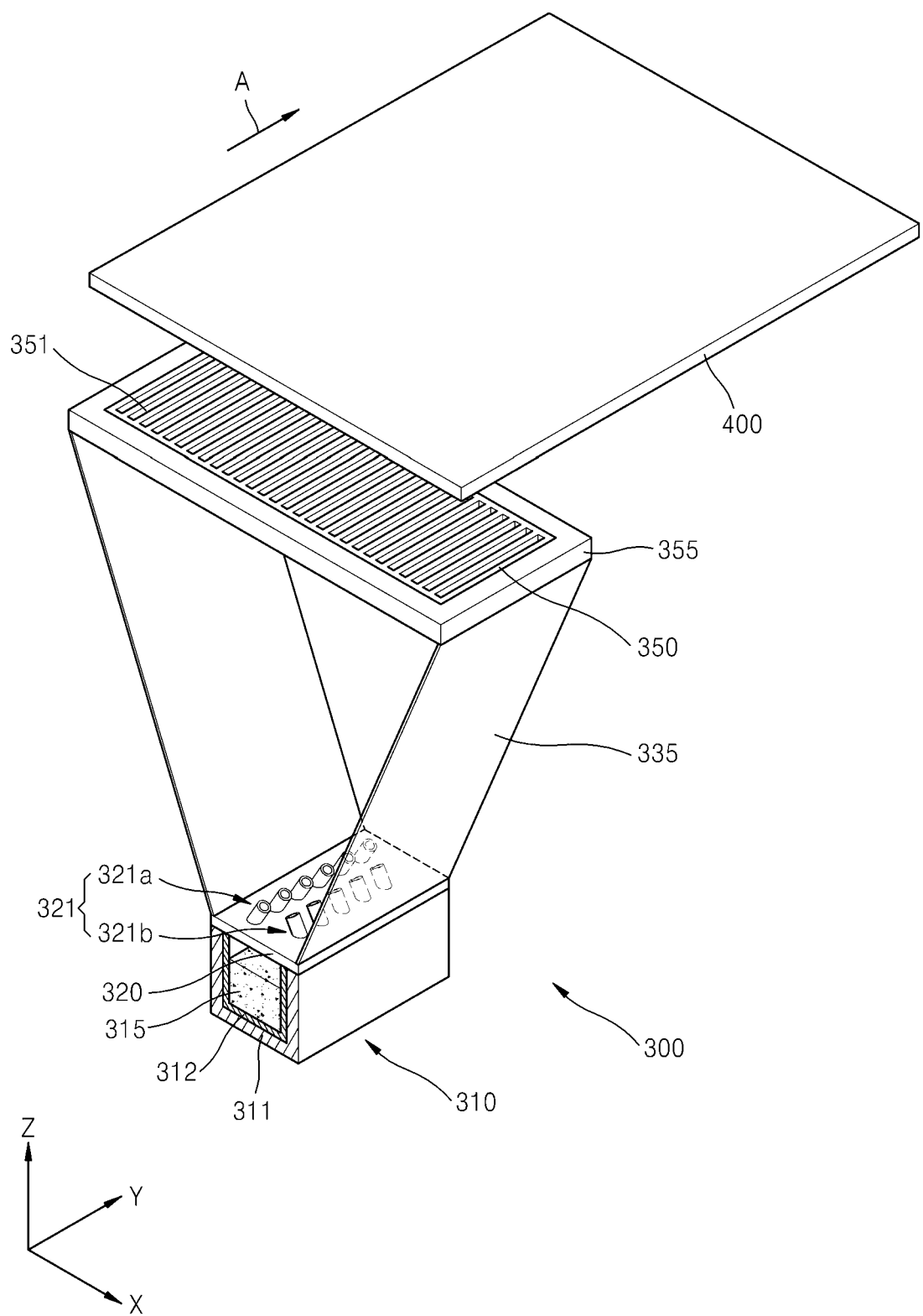
FIG. 10 is a schematic perspective view of a thin film deposition apparatus according to an embodiment of the present invention.

FIG. 10 is a schematic perspective view of a thin film deposition apparatus 300 according to another embodiment of the present invention. Referring to FIG. 10, the thin film deposition apparatus 300 includes a deposition source 310, a first nozzle 320, a second nozzle 350, and a plurality of second nozzle reinforcement units (not shown). The deposition source 310 includes a crucible 311 that is filled with a deposition material 315, and a heater 312 that heats the crucible 311 to vaporize the deposition material 315 contained in the crucible 311 toward the first nozzle 320. The first nozzle 320 is disposed at a side of the deposition source 310. The first nozzle 320 includes a plurality of first slits 321 arranged in the Y-axis direction. The second nozzle 350 and a second nozzle frame 355 are further disposed between the deposition source 310 and the substrate 400, and the second nozzle 350 includes a plurality of second slits 351 arranged in the X-axis direction. The first deposition source 310, the first nozzle 320, and the second nozzle 350 are connected to each other by the connection unit 335.

Although not shown, the plurality of second nozzle reinforcement units are disposed on a bottom surface of the second nozzle 350, i.e., a surface of the second nozzle 350 facing away from the substrate 400. The structure of the second nozzle reinforcement units is the same as that of the second nozzle reinforcement units 153 illustrated in FIGS. 5 and 6.

The thin film deposition apparatus 300 is differentiated from the thin film deposition apparatus 100 of FIG. 1 in that the plurality of first slits 321 formed in the first nozzle 321 are tilted at a predetermined angle. In particular, each of the first slits 321 may include first sub slits 321a and 321b arranged in two rows. The first sub slits 321a and 321b are alternately arranged in two rows. The first sub slits 321a and 321b may be tilted at a predetermined angle on an X-Z plane.

The first sub slits 321a in a first row may be tilted toward the first sub slits 321b in a second row, and the first sub slits 321b in the second row may be tilted toward the first sub slits 321a in the first row. That is, the first sub slits 321a in a row to the left of the first nozzle 320 are arranged to face the right side of the second nozzle 350, and the first sub slits 321b in a row to the right of the first nozzle 320 are arranged to face the left side of the second nozzle 350.

Figure 11:
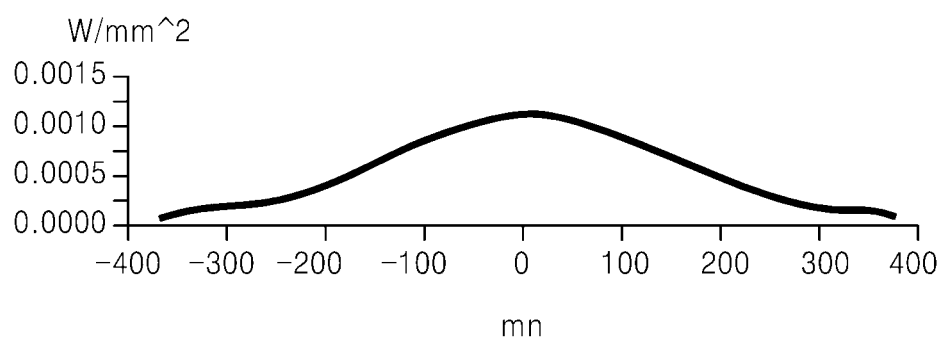
FIG. 11 is a graph schematically illustrating a distribution pattern of a thin film deposited on a substrate when a plurality of first slits are not tilted, in a thin film deposition apparatus according to an embodiment of the present invention.
Figure 12:
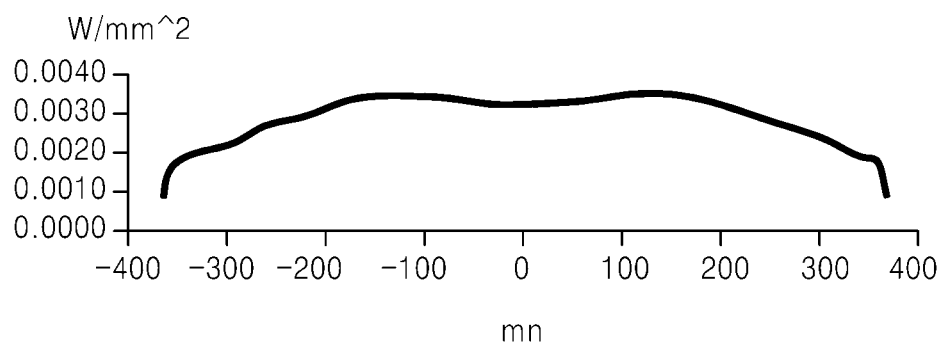
FIG. 12 is a graph schematically illustrating a distribution pattern of a thin film deposited on a substrate when a plurality of first slits are tilted, in a thin film deposition apparatus according to an embodiment of the present invention.

FIG. 11 is a graph schematically illustrating a distribution pattern of a thin film deposited on a substrate when a plurality of first slits are not tilted, in a thin film deposition apparatus according to an embodiment of the present invention. FIG. 12 is a graph schematically illustrating a distribution pattern of a thin film deposited on a substrate when a plurality of first slits are tilted, in a thin film deposition apparatus according to an embodiment of the present invention. Comparing the graphs of FIGS. 11 and 12 with each other, the thicknesses of both end portions of the thin film deposited on the substrate when the plurality of first slits are tilted are greater than when the plurality of first slits are not tilted, thereby increasing the uniformity of the thin film.

Accordingly, the deposition amount of the deposition material may be adjusted so that a difference between the thicknesses of the thin film at the center portion and end portions of the substrate may be reduced and the entire thickness of the thin film may be constant, and moreover, the efficiency of utilizing the deposition material may be improved.

Accordingly, a thin film deposition apparatus according to the present invention is suitable for forming a fine pattern on a large substrate.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A thin film deposition apparatus comprising:
    a deposition source;
    a first nozzle disposed at a side of the deposition source, the first nozzle having a length in a first direction and a width in a second direction substantially perpendicular to the first direction and including a plurality of first slits arranged along the first direction,
    the length and the width of the first nozzle being less than a length and a width, respectively, of a deposition target;
    a second nozzle disposed opposite to the first nozzle and including a plurality of second slits elongated in the first direction and all of the second slits are arranged in a row along the second direction, a length of the second nozzle in the first direction being less than the length of the deposition target in the first direction and wherein a width of the second nozzle is substantially equal to a width of the target; and
    at least one second nozzle reinforcement unit disposed on the second nozzle and crossing the second slits,
    the thin film deposition apparatus being configured to be spaced from and movable with respect to the deposition target during deposition.

2. The thin film deposition apparatus of claim 1, wherein the at least one second nozzle reinforcement unit is disposed on a side of the second nozzle facing the deposition source.

3. The thin film deposition apparatus of claim 1, wherein the at least one second nozzle reinforcement unit is disposed on a surface of the second nozzle facing away from the deposition target.

4. The thin film deposition apparatus of claim 1, wherein the at least one second nozzle reinforcement unit contacts the second nozzle.

5. The thin film deposition apparatus of claim 1, wherein a unique number of oscillations of the at least one second nozzle reinforcement unit is different from a unique number of oscillations of the second nozzle.

6. The thin film deposition apparatus of claim 1, wherein the at least one second nozzle reinforcement unit is installed in a lengthwise direction of the second nozzle.

7. The thin film deposition apparatus of claim 1, wherein the second nozzle reinforcement unit extends along a direction in which the second slits are arranged.

8. The thin film deposition apparatus of claim 1, wherein
the thin film deposition apparatus performs deposition while being moved relative to the deposition target in the first direction, and
the deposition source, the first nozzle, and the second nozzle are formed integrally with one another.

9. The thin film deposition apparatus of claim 8, wherein the deposition source, the first nozzle, and the second nozzle are formed integrally with one another by being coupled to one another via a connection unit.

10. The thin film deposition apparatus of claim 9, wherein the connection unit guides movement of deposition material contained in the deposition source.

11. The thin film deposition apparatus of claim 9, wherein the connection unit seals a deposition space among the deposition source, the first nozzle, and the second nozzle.

12. The thin film deposition apparatus of claim 8, wherein deposition material is continuously deposited on the deposition target while the deposition target is moved relative to the thin film deposition apparatus in the first direction.

13. The thin film deposition apparatus of claim 1, wherein the thin film deposition apparatus is disposed in a vacuum chamber.

14. The thin film deposition apparatus of claim 1, wherein the second nozzle is separated a certain distance from the deposition target on which a deposition material vaporized in the deposition source is deposited.

15. The thin film deposition apparatus of claim 1, further comprising a second nozzle frame coupled to regions of the second nozzle in which the second slits are not formed.

16. The thin film deposition apparatus of claim 15, wherein the second nozzle frame exerts a predetermined tensile force on the second nozzle.

17. The thin film deposition apparatus of claim 15, wherein a temperature of the second nozzle frame is maintained substantially constant during deposition.

18. The thin film deposition apparatus of claim 1, wherein a total number of the second slits is greater than a total number of the first slits.

* * * * *